US012563931B2

(12) United States Patent

Jo et al.

(10) Patent No.: US 12,563,931 B2

(45) Date of Patent: Feb. 24, 2026

(54) DISPLAY PANEL

(71) Applicant: Samsung Display Co., Ltd., Yongin-si (KR)

(72) Inventors: Kangmoon Jo, Hwaseong-si (KR); Tak-Young Lee, Anyang-si (KR); Bogyeong Kim, Seongnam-si (KR); Yang-Hwa Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 453 days.

(21) Appl. No.: 18/100,788

(22) Filed: Jan. 24, 2023

(65) Prior Publication Data

US 2023/0247878 A1 Aug. 3, 2023

(30) Foreign Application Priority Data

Jan. 28, 2022 (KR) ........................ 10-2022-0012999

(51) Int. Cl.
*H10K 59/131* (2023.01)
*H10K 59/121* (2023.01)
(Continued)

(52) U.S. Cl.
CPC ..... *H10K 59/1315* (2023.02); *H10K 59/1213* (2023.02); *H10K 59/8792* (2023.02); *H10K 59/121* (2023.02); *H10K 59/123* (2023.02)

(58) Field of Classification Search
CPC .......... H10K 59/1315; H10K 59/1213; H10K 59/8792; H10K 59/121; H10K 59/123; H10K 59/131; G09G 3/20; G09G 2300/0421; G09G 2300/0439; G09G 2300/0469; G09G 2310/02; G09G 2320/02; G09G 2320/04; G09G 3/3233;
(Continued)

(56) References Cited

U.S. PATENT DOCUMENTS 9,704,438 B2 7/2017 Lee
9,859,334 B2 1/2018 Kim et al.
(Continued)

FOREIGN PATENT DOCUMENTS

CN 113764474 A * 12/2021 ........... H10H 29/142
KR 1020150138475 A 12/2015
(Continued)

*Primary Examiner* — Steven B Gauthier
*Assistant Examiner* — Alvin L Lee
(74) *Attorney, Agent, or Firm* — CANTOR COLBURN LLP

(57) ABSTRACT

A display panel includes a base layer, first to third pixels, data lines, a first voltage line that is connected to the first to third pixels and that extends in a second direction, and an initialization voltage line that is connected to the first to third pixels and that extends in the second direction. Each of the first to third pixels includes a light-emitting element including an anode, a first transistor that is connected between the first voltage line and the anode and that includes a gate electrode, a second transistor connected with a data line of the data lines, a third transistor that is connected between the initialization voltage line and a node and that includes a gate electrode, and a fourth transistor that is connected between the node and the anode and that includes a gate electrode connected with the first voltage line.

20 Claims, 26 Drawing Sheets

(51) Int. Cl.
    *H10K 59/123*     (2023.01)
    *H10K 59/80*     (2023.01)

(58) Field of Classification Search
    CPC ... G09G 2300/0809; G09G 2300/0426; H10H
                            29/32; H10H 29/39
    See application file for complete search history.

(56)              References Cited

U.S. PATENT DOCUMENTS

| | | | |
|---|---|---|---|
| 10,629,845 | B2 | 4/2020 | Kim et al. |
| 10,930,215 | B2 | 2/2021 | Xu |
| 2018/0137807 | A1* | 5/2018 | Cheng .................. G09G 3/2092 |
| 2020/0005709 | A1* | 1/2020 | Kim ..................... H10K 59/353 |
| 2020/0105849 | A1 | 4/2020 | Kim et al. |
| 2020/0119115 | A1 | 4/2020 | Moon et al. |
| 2021/0256892 | A1 | 8/2021 | Kang |
| 2022/0051619 | A1* | 2/2022 | Shiau ........................ G09G 3/32 |
| 2022/0344425 | A1* | 10/2022 | Zhu .................... H10K 59/1216 |

FOREIGN PATENT DOCUMENTS

| | | | |
|---|---|---|---|
| KR | 1020170080335 | A | 7/2017 |
| KR | 1020170134903 | A | 12/2017 |
| KR | 1020180013433 | A | 2/2018 |
| KR | 1020190109690 | A | 9/2019 |
| KR | 1020200037027 | A | 4/2020 |
| KR | 1020200040967 | A | 4/2020 |

* cited by examiner

FIG. 3

FIG. 6D
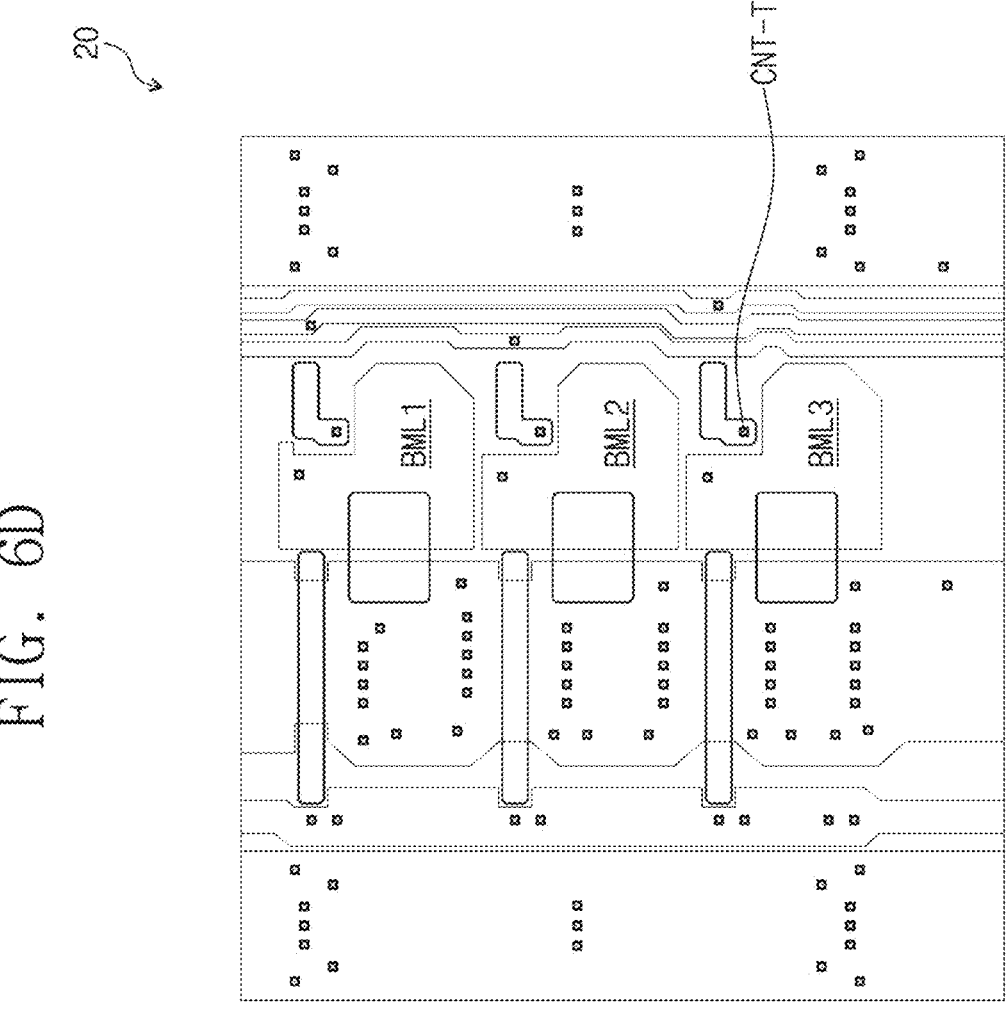
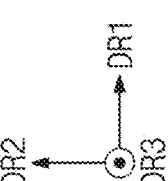

BML1

BML2

BML3

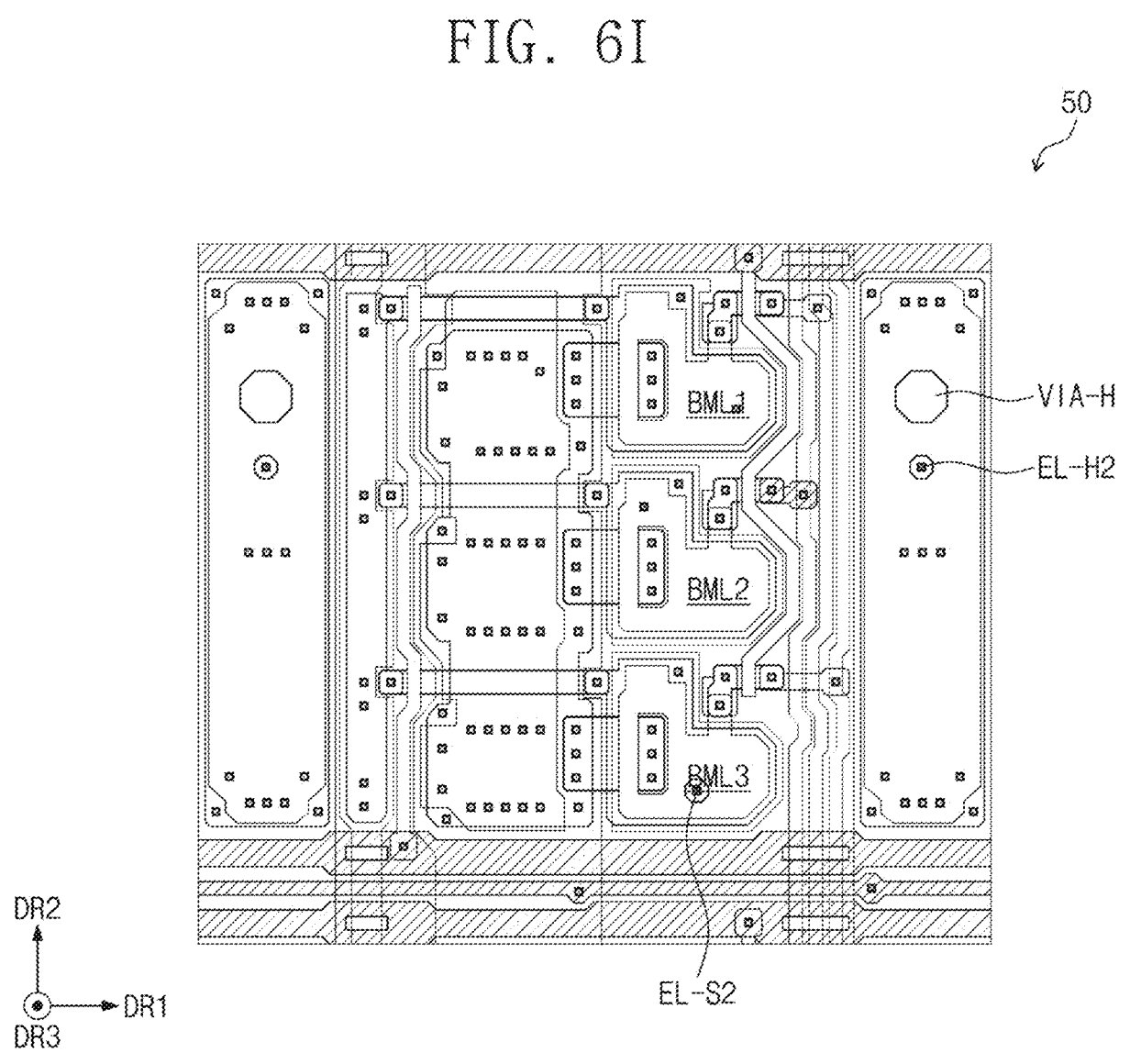

FIG. 6J
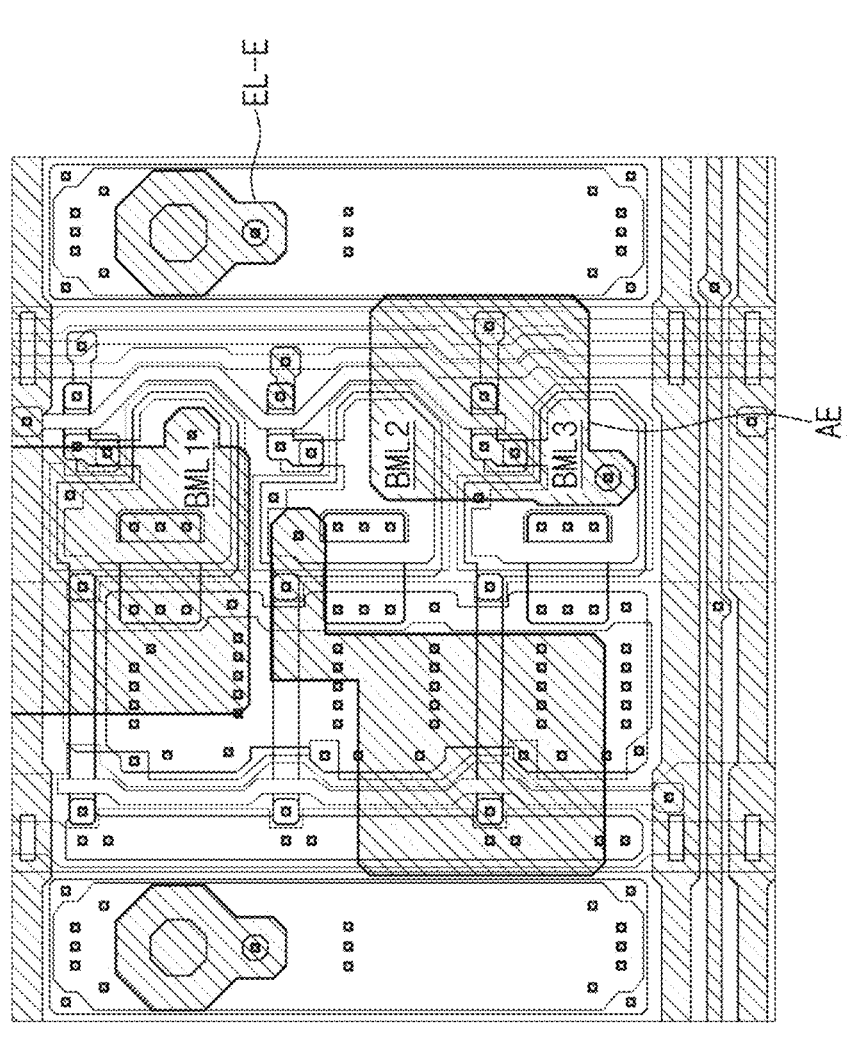
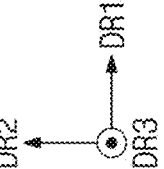

PDL

OP2

EL-E

AE

OP1

DR2 ← ⊙ → DR1
     DR3

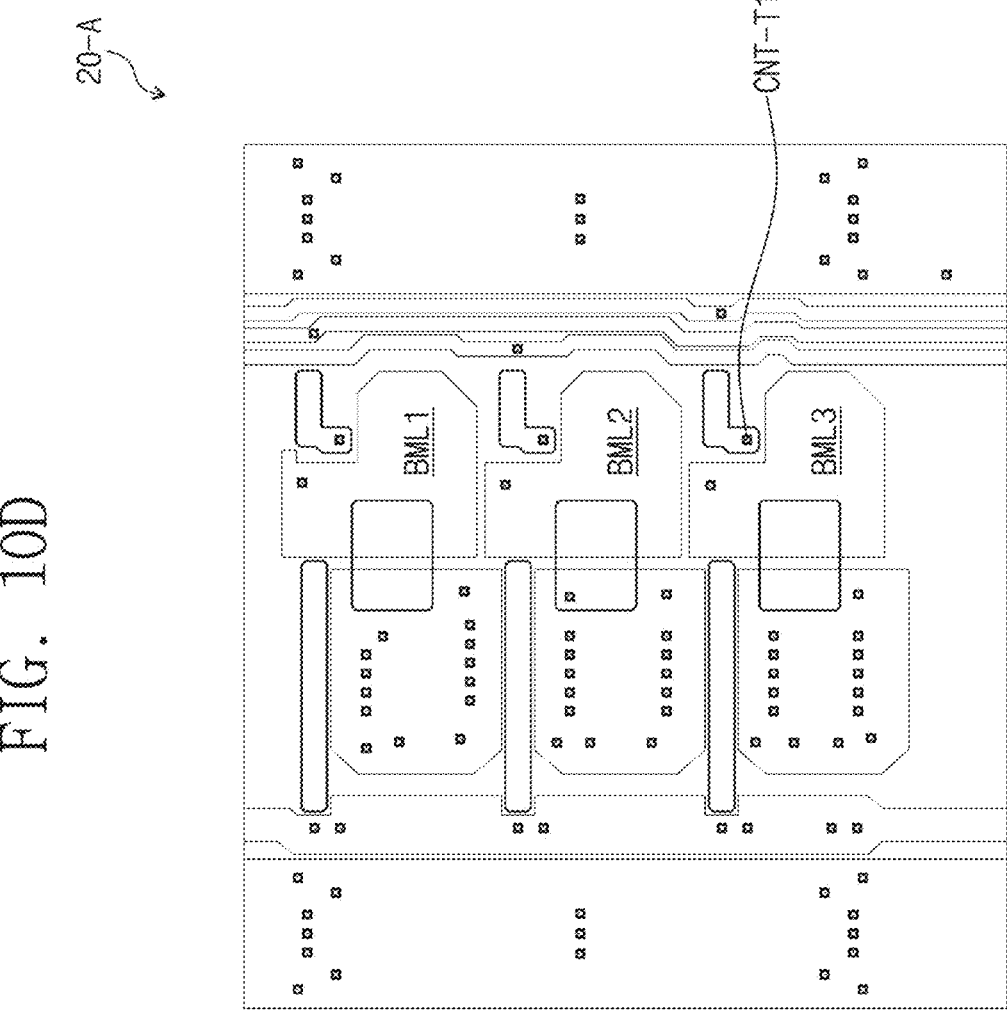
FIG. 10D
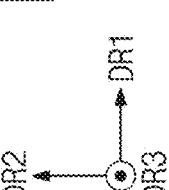

FIG. 10G
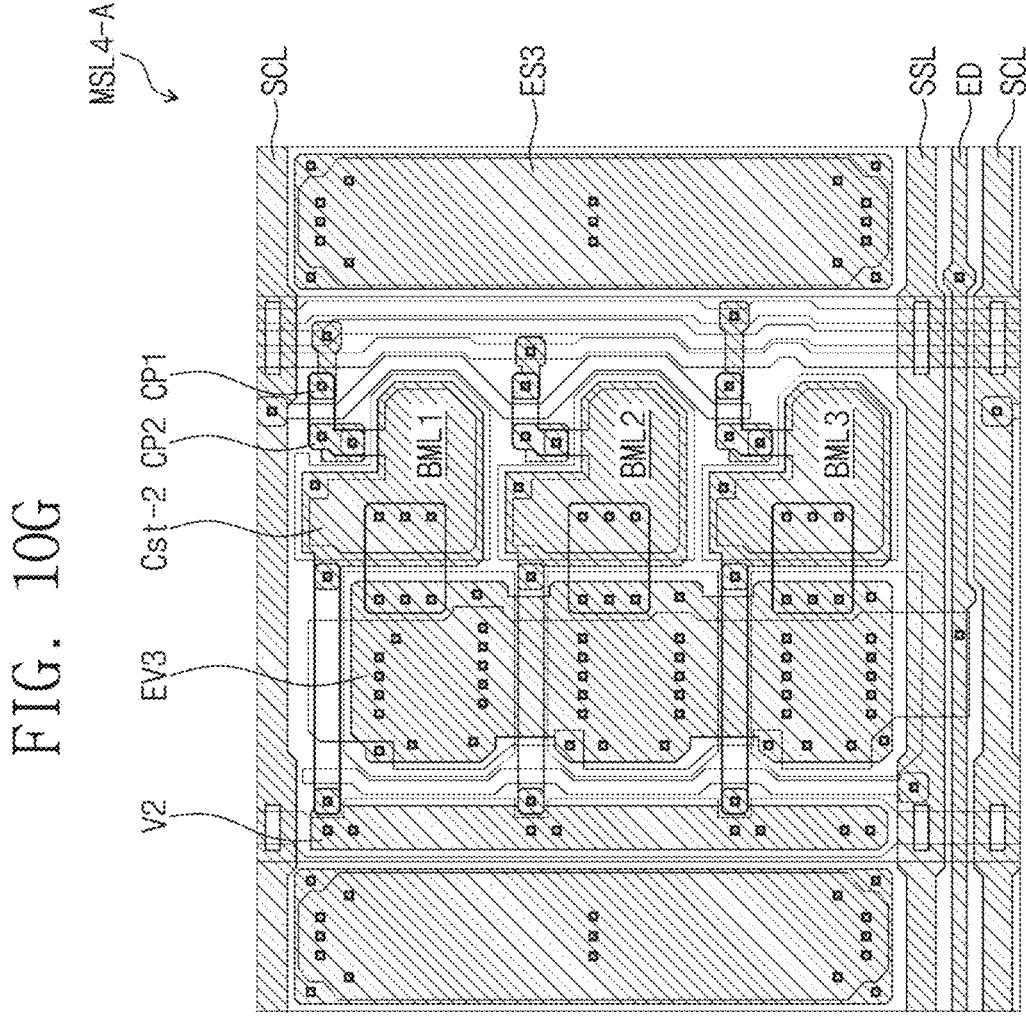
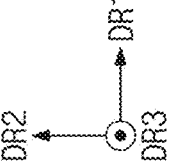

DISPLAY PANEL

This application claims priority to Korean Patent Application No. 10-2022-0012999, filed on Jan. 28, 2022, and all the benefits accruing therefrom under 35 U.S.C. § 119, the content of which in its entirety is herein incorporated by reference.

BACKGROUND

1. Field

Embodiments of the disclosure described herein relate to a display panel, and more particularly, relate to a display panel in which a voltage line applying a high level of voltage includes a low-resistance circuit element.

2. Description of the Related Art

A display panel includes a plurality of pixels and drive circuits (e.g., a scan drive circuit and a data drive circuit) that control the plurality of pixels. Each of the plurality of pixels includes a display element and a pixel drive circuit that controls the display element. The pixel drive circuit may include a plurality of transistors organically connected together.

The scan drive circuit and/or the data drive circuit may be formed through the same process as that of the plurality of pixels. The scan drive circuit and/or the data drive circuit may include a plurality of transistors organically connected together.

SUMMARY

Embodiments of the disclosure provide a display panel having improved display quality.

In an embodiment of the disclosure, a display panel includes a base layer, first to third pixels disposed on the base layer, data lines, each of which is connected to a corresponding pixel among the first to third pixels, the data lines being spaced apart from each other in a first direction and extending in a second direction crossing the first direction, a first voltage line that is connected to the first to third pixels and that extends in the second direction, and an initialization voltage line that is connected to the first to third pixels and that extends in the second direction. Each of the first to third pixels includes a light-emitting element including an anode, a first transistor that is connected between the first voltage line and the anode and that includes a gate electrode, a second transistor that is connected between a data line of the data lines and the gate electrode of the first transistor and that includes a gate electrode, a third transistor that is connected between the initialization voltage line and a node and that includes a gate electrode, and a fourth transistor that is connected between the node and the anode and that includes a gate electrode connected with the first voltage line.

In an embodiment, the fourth transistor may further include an additional gate electrode that branches off from the first voltage line and that is disposed in a different layer from the gate electrode of the fourth transistor.

In an embodiment, the first voltage line may include first patterns, second patterns, and third patterns sequentially stacked and connected together.

In an embodiment, the first patterns may be connected in the second direction and constitute an integral pattern, the second patterns may be connected in the second direction and constitute an integral pattern, and the third patterns may be connected in the second direction and constitute an integral pattern.

In an embodiment, the first patterns may be arranged in the second direction so as to be spaced apart from each other, the second patterns may be connected in the second direction and constitute an integral pattern, and the third patterns may be connected in the second direction and constitute an integral pattern.

In an embodiment, the gate electrode of the third transistor may be disposed in the same layer as the gate electrode of the fourth transistor.

In an embodiment, the third transistor may include a semiconductor pattern including a first electrode connected with the initialization voltage line and a second electrode connected with the node. The fourth transistor may include a semiconductor pattern connected with the node. The semiconductor pattern of the third transistor and the semiconductor pattern of the fourth transistor may constitute an integral pattern.

In an embodiment, the integral pattern may extend in the first direction.

In an embodiment, the display panel may further include light-blocking patterns that are disposed between the first voltage line and the data lines and that overlap the pixels, respectively.

In an embodiment, the light-blocking patterns may be arranged in the second direction so as to be spaced apart from each other.

In an embodiment of the disclosure, a display panel includes a base layer, first to third pixels disposed on the base layer, data lines, each of which is connected to a corresponding pixel among the first to third pixels, the data lines being spaced apart from each other in a first direction and extending in a second direction crossing the first direction, a first voltage line that is connected to the first to third pixels and that extends in the second direction, and an initialization voltage line that is connected to the first to third pixels and that extends in the second direction. Each of the first to third pixels includes a light-emitting element including an anode, a first transistor including a semiconductor pattern and a gate electrode that are connected between the first voltage line and the anode, a second transistor including a semiconductor pattern and a gate electrode that are connected between a data line of the data lines and the gate electrode of the first transistor, a third transistor including a semiconductor pattern and a gate electrode that are connected between the initialization voltage line and the semiconductor pattern of the first transistor, and a fourth transistor including a semiconductor pattern connected between the semiconductor pattern of the first transistor and the semiconductor pattern of the third transistor and a gate electrode connected with the first voltage line. The semiconductor pattern of the third transistor and the semiconductor pattern of the fourth transistor constitute an integral pattern.

In an embodiment, the fourth transistor may further include an additional gate electrode that branches off from the first voltage line and that is disposed in a different layer from the gate electrode of the fourth transistor.

In an embodiment, the first voltage line may include first patterns, second patterns, and third patterns sequentially stacked and connected together.

The first patterns may be connected in the second direction and constitute an integral pattern, the second patterns may be connected in the second direction and constitute an integral pattern, and the third patterns may be connected in the second direction and constitute an integral pattern.

In an embodiment, the first patterns may be arranged in the second direction so as to be spaced apart from each other, the second patterns may be connected in the second direction and constitute an integral pattern, and the third patterns may be connected in the second direction and constitute an integral pattern.

In an embodiment, the gate electrode of the third transistor may be disposed in the same layer as the gate electrode of the fourth transistor.

In an embodiment, the semiconductor pattern included in each of the first to fourth transistors may include an oxide semiconductor.

In an embodiment, the display panel may further include light-blocking patterns that are disposed between the first voltage line and the data lines and that overlap the pixels, respectively.

In an embodiment, the light-blocking patterns may be arranged in the second direction so as to be spaced apart from each other.

In an embodiment, the integral pattern may extend in the first direction between the initialization voltage line and a corresponding light-blocking pattern among the light-blocking patterns.

BRIEF DESCRIPTION OF THE DRAWINGS

The above and other objects and features of the disclosure will become apparent by describing in detail embodiments thereof with reference to the accompanying drawings.

FIG. 3 is a plan view of an embodiment of the display panel according to the disclosure.

FIGS. 6A to 6K are plan views illustrating an embodiment of layers according to the stacking sequence of the conductive patterns included in the unit pixel according to the disclosure.

FIGS. 10A to 10G are plan views illustrating an embodiment of layers according to the stacking sequence of the conductive patterns included in the unit pixel according to the disclosure.

DETAILED DESCRIPTION

Figure 1A:
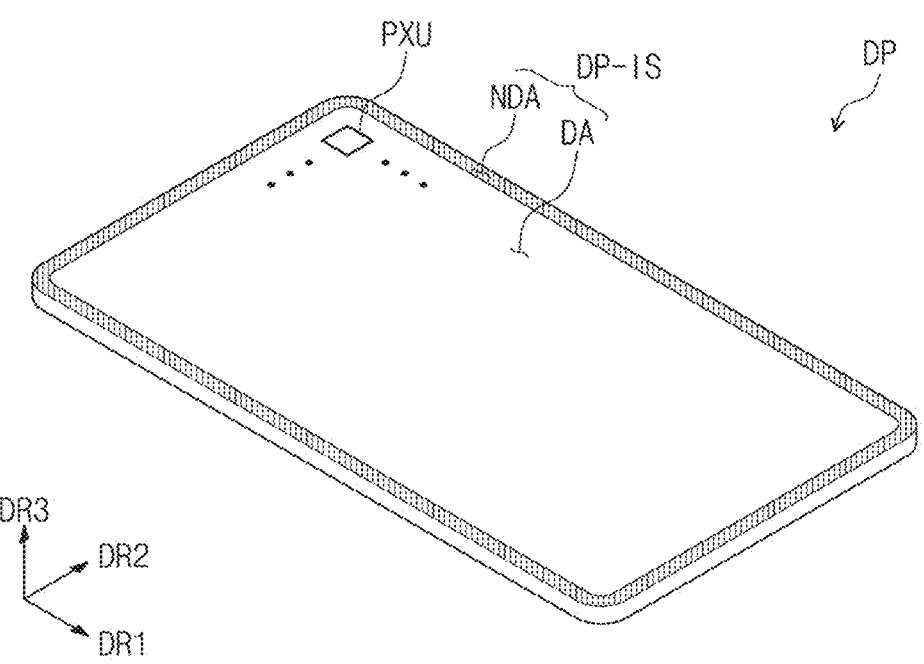
FIG. 1A is a perspective view of an embodiment of a display panel according to the disclosure.

In this specification, when it is mentioned that a component (or an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Unless otherwise defined, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

Hereinafter, embodiments of the disclosure will be described with reference to the accompanying drawings.

Figure 1B:
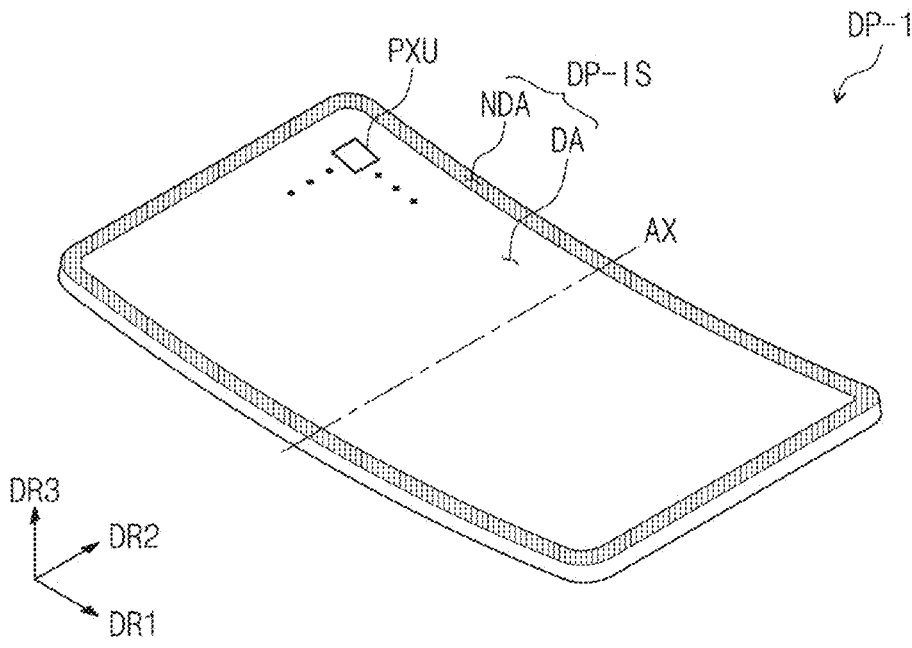
FIG. 1B is a perspective view of an embodiment of a curved display panel according to the disclosure.
Figure 2:
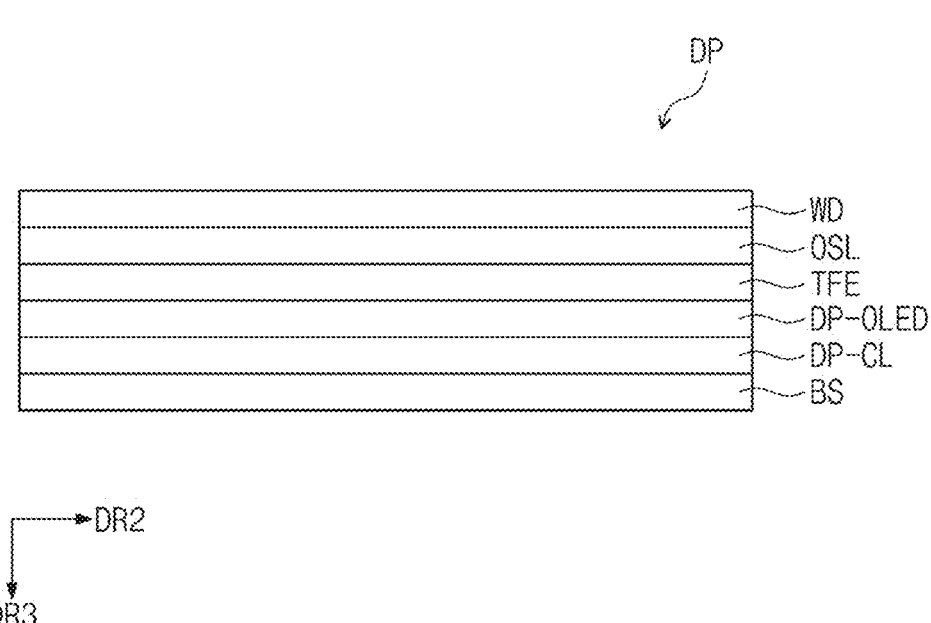
FIG. 2 is a cross-sectional view of an embodiment of the display panel according to the disclosure.
Figure 3:
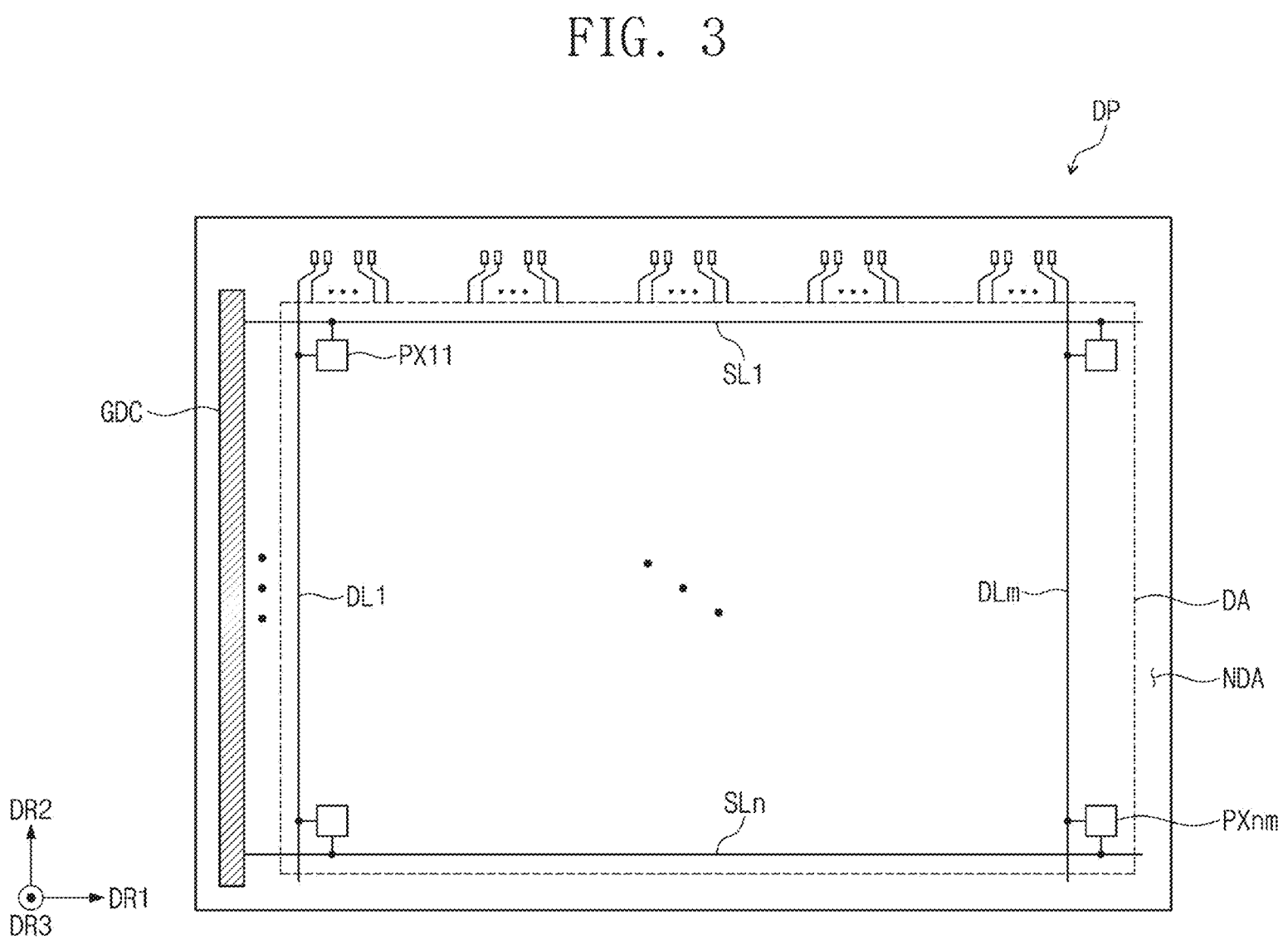
Figure 4:
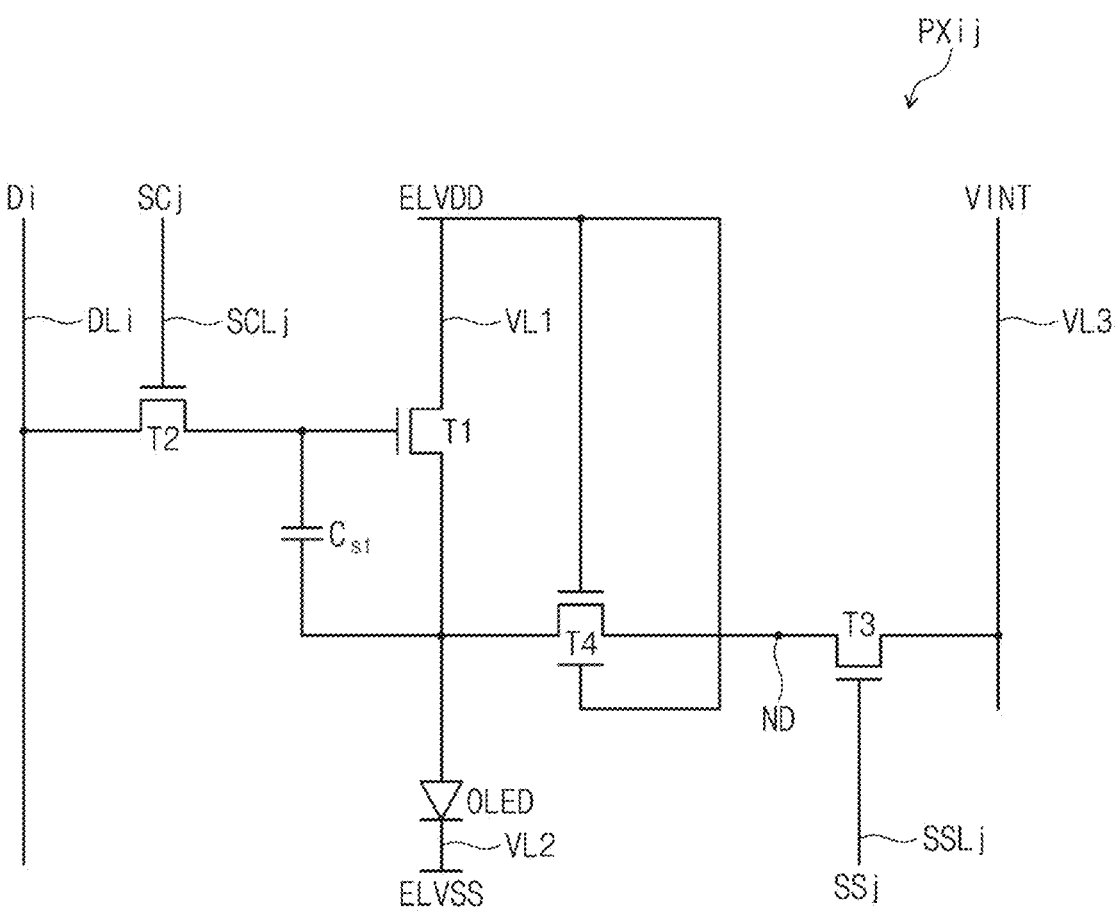
FIG. 4 is an equivalent circuit diagram of an embodiment of a pixel according to the disclosure.

FIG. 1A is a perspective view of an embodiment of a display panel according to the disclosure. FIG. 1B is a perspective view of an embodiment of a curved display panel according to the disclosure. FIG. 2 is a cross-sectional view of an embodiment of the display panel according to the disclosure. FIG. 3 is a plan view of an embodiment of the display panel according to the disclosure. FIG. 4 is an equivalent circuit diagram of an embodiment of a pixel according to the disclosure.

The display panels DP and DP-1 illustrated in FIGS. 1A and 1B may be emissive display panels and may include one of a liquid crystal display panel, an electrophoretic display panel, a microelectromechanical system ("MEMS") display panel, an electrowetting display panel, an organic light-emitting display panel, an inorganic light-emitting display panel, and a quantum-dot display panel.

Furthermore, the display panels DP and DP-1 in embodiments of the disclosure may include a micro light-emitting element. In an embodiment, the display panels DP and DP-1 may include a micro light-emitting diode ("micro-LED") element and/or a nano LED element, for example, and are not particularly limited.

Referring to FIG. 1A, the display panel DP may display an image through a display surface DP-IS. The upper surface of a member disposed at the top of the display panel DP may be defined as the display surface DP-IS. According to the disclosure, the upper surface of a window panel WD illustrated in FIG. 2 may be provided as the display surface DP-IS of the display panel DP.

The display surface DP-IS may be parallel to a plane defined by a first direction DR1 and a second direction DR2. The normal direction of the display surface DP-IS, that is, the thickness direction of the display panel DP indicates a third direction DR3. The front surfaces (or the upper surfaces) and the rear surfaces (or the lower surfaces) of layers or units to be described below are distinguished from each other based on the third direction DR3.

The display panel DP may include a display area DA and a non-display area NDA. The display area DA may be defined as an area through which light generated from a unit pixel PXU is substantially provided to a user. The non-display area NDA may be an area having a lower light transmittance than that of the display area DA. The non-display area NDA is defined along the periphery of the display surface DP-IS. The non-display area NDA may surround the display area DA. In an embodiment of the disclosure, the non-display area NDA be omitted, or may be disposed on only one side of the display area DA.

Referring to FIG. 1B, the display panel DP-1 according to an embodiment may be curved in the first direction DR1 with respect to a virtual axis AX extending in the second direction DR2. However, without being limited thereto, the axis may extend in the first direction DR1, or the display panel DP-1 may be curved with respect to a plurality of axes extending in different directions.

Unit pixels PXU are disposed in the display areas DA of FIGS. 1A and 1B, respectively. Each of the unit pixels PXU may include at least two pixels that provide different light. In an embodiment, the unit pixel PXU may be an area in which pixels providing green, red, and blue light are disposed, for example. The light-emitting areas, shapes, and arrangement forms of the pixels included in the unit pixel PXU are not limited to any particular embodiment. In an embodiment, the pixels included in the unit pixel PXU may the same light-emitting area or different light-emitting areas. Furthermore, the emissive regions of the pixels may have a circular, oval, or polygonal shape in the plan view, for example.

Referring to FIG. 2, the display panel DP according to the disclosure includes a base layer BS, a circuit element layer DP-CL, a display element layer DP-OLED, a thin film encapsulation layer TFE, a light control layer OSL, and the window panel WD. The display panel DP may further include functional layers, such as an anti-reflection layer, a reflective index control layer, or the like.

The base layer BS may include a synthetic resin film. The synthetic resin film may include a thermosetting resin. In particular, the synthetic resin film may include at least one of an acryl-based resin, a methacryl-based resin, a polyisoprene-based resin, a vinyl-based resin, an epoxy-based resin, a urethane-based resin, a celluose-based resin, a siloxane-based resin, a polyamide-based resin, and a perylene-based resin. In addition, the base layer BS may include a glass substrate, a metal substrate, or an organic/inorganic composite substrate.

The circuit element layer DP-CL includes a plurality of insulating layers and circuit elements such as transistors. The insulating layers to be described below may include an organic layer and/or an inorganic layer.

Insulating layers, semiconductor patterns, and conductive layers are formed through a process such as coating, deposition, or the like. Thereafter, the insulating layers, the semiconductor patterns, and the conductive layers may be selectively subjected to patterning through a photolithography process and an etching process. The semiconductor patterns, conductive patterns, and signal lines are formed through these processes. Patterns disposed in the same layer are formed through the same process.

The circuit element layer DP-CL includes a drive circuit or a signal line that constitutes each of the pixels included in the unit pixel PXU. The display element layer DP-OLED may include a pixel defining film PDL (refer to FIG. 7) and light-emitting elements OLED (refer to FIG. 7) of the pixels included in the unit pixel PXU.

The thin film encapsulation layer TFE may be disposed on the display element layer DP-OLED and may protect the light-emitting elements OLED. The thin film encapsulation layer TFE may include inorganic layers and an organic layer disposed between the inorganic layers. The inorganic layers may protect the light-emitting elements OLED from moisture and oxygen, and the organic layer may protect the light-emitting elements OLED from foreign matter such as dust particles.

The light control layer OSL may include light control patterns capable of converting optical properties of source light generated from the light-emitting elements OLED. The light control patterns may include quantum dots. The light control layer OSL may include color filter patterns that selectively transmit light passing through the light control patterns.

The window panel WD may be disposed on the top of the display panel DP and may transmit an image provided from the display panel DP to the outside. The window panel WD may distinguish the display area DA and the non-display area NDA of the display surface DP-IS as illustrated in FIG. 1A. The border between the display area DA and the non-display area NDA may be defined by a bezel pattern that is disposed under the window panel WD and that absorbs light.

The window panel WD may include a base substrate and functional layers disposed on the base substrate. The functional layers may include a protective layer, an anti-fingerprint layer, or the like. The base substrate of the window panel WD may include glass, sapphire, or plastic.

FIG. 3 illustrates a planar arrangement relationship between signal lines SL1 to SLn and DL1 to DLm and pixels PX11 to PXnm included in the display panel DP. Here, n and m are natural numbers. The signal lines SL1 to SLn and DL1 to DLm may include the plurality of scan lines SL1 to SLn and the plurality of data lines DL1 to DLm.

The pixels PX11 to PXnm may be disposed in the display area DA. Each of the pixels PX11 to PXnm is connected to a corresponding one of the plurality of scan lines SL1 to SLn and a corresponding one of the plurality of data lines DL1 to DLm. Each of the pixels PX11 to PXnm may include a pixel drive circuit and a light-emitting element. The display panel DP may include more types of signal lines depending on the configurations of the pixel drive circuits of the pixels PX11 to PXnm. Among the pixels PX11 to PXnm, at least two pixels that generate different colors or the same color may be included in the one unit pixel PXU described above with reference to FIGS. 1A and 1B.

A gate driver circuit GDC may be disposed in the non-display area NDA. The gate driver circuit GDC may be integrated into the display panel DP through an oxide silicon gate driver circuit ("OSG") process or an amorphous silicon gate driver circuit ("ASG") process.

FIG. 4 illustrates a circuit diagram of one pixel PXij among the pixels PX11 to PXnm. The j-th first scan line SCLj or the j-th second scan line SSLj illustrated in FIG. 4 may be one of the scan lines SL1 to SLn illustrated in FIG. 3, and the i-th data line DLi may be one of the data lines DL1 to DLm. That is, i may be a natural number equal to or less than m, and j may be a natural number equal to or less than n.

Each of the pixels included in the unit pixels PXU illustrated in FIGS. 1A and 1B may have the same circuit configuration as the equivalent circuit diagram of the pixel PXij illustrated in FIG. 4. The pixel PXij according to an embodiment may include at least one light-emitting element OLED and a pixel circuit.

The light-emitting element OLED may be an organic light-emitting element or an inorganic light-emitting element that includes an anode (a first electrode) and a cathode (a second electrode). The anode of the light-emitting element OLED may receive a first drive voltage ELVDD through a first transistor T1, and the cathode of the light-emitting element OLED may receive a second drive voltage ELVSS. The light-emitting element OLED may receive the first drive voltage ELVDD and the second drive voltage ELVSS and may emit light.

The pixel circuit may include at least one transistor that is electrically connected with the light-emitting element OLED and that provides an electric current corresponding to a data signal Di transferred from the data line DLi to the light-emitting element OLED. In this embodiment, the pixel circuit of the pixel PXij includes the first transistor T1, a second transistor T2, a third transistor T3, a fourth transistor T4, and a capacitor Cst. Each of the first to fourth transistors T1, T2, T3, and T4 is an N-type transistor with an oxide semiconductor as a semiconductor pattern.

However, the disclosure is not limited thereto, and each of the first to fourth transistors T1, T2, T3, and T4 may be a P-type transistor having a low-temperature polycrystalline silicon ("LTPS") semiconductor pattern. In an embodiment, at least one of the first to fourth transistors T1, T2, T3, and T4 may be an N-type transistor, and the rest may be P-type transistors. Furthermore, the configuration of the pixel circuit according to the disclosure is not limited to FIG. 4. The pixel circuit illustrated in FIG. 4 is merely illustrative, and various changes and modifications may be made to the configuration of the pixel circuit.

The first scan line SCLj may transfer a first scan signal SCj, and the second scan line SSLj may transfer a second scan signal SSj. The data line DLi transfers the data signal Di. The data signal Di may have a voltage level corresponding to an input image signal that is input to the display panel DP (refer to FIG. 1A).

A first voltage line VL1 may transfer the first drive voltage ELVDD to the pixel circuit, and a third voltage line VL3 may transfer an initialization voltage VINT to the pixel circuit. A second voltage line VL2 may transfer the second drive voltage ELVSS to the cathode (or the second electrode) of the light-emitting element OLED.

The first transistor T1 includes a first electrode connected with the first voltage line VL1, a second electrode electrically connected with the anode (the first electrode) of the light-emitting element OLED, and a gate electrode connected with one end of the capacitor Cst. The first transistor T1 may supply a drive current to the light-emitting element OLED in response to the data signal Di transferred by the data line DLi depending on a switching operation of the second transistor T2.

The second transistor T2 includes a first electrode connected with the data line DLi, a second electrode connected with the gate electrode of the first transistor T1, and a gate electrode connected with the first scan line SCLj. The second transistor T2 may be turned on in response to the first scan signal SCj transferred through the first scan line SCLj and may transfer, to the gate electrode of the first transistor T1, the data signal Di transferred from the data line DLi.

The third transistor T3 includes a first electrode connected with the third voltage line VL3 (the initialization voltage line), a second electrode connected with the anode of the light-emitting element OLED, and a gate electrode connected with the second scan line SSLj. The third transistor T3 may be turned on in response to the second scan signal SSj transferred through the second scan line SSLj and may transfer the initialization voltage VINT to the anode of the light-emitting element OLED. In this embodiment, the second electrode of the third transistor T3 may be connected with a node ND.

The fourth transistor T4 includes a first electrode connected with the node ND, a second electrode connected with the anode of the light-emitting element OLED, and a gate electrode connected with the first voltage line VL1. The fourth transistor T4 may be turned on by receiving the first drive voltage ELVDD from the first voltage line VL1. Accordingly, the length between the first electrode and the second electrode of the fourth transistor T4 may act as resistance to the first drive voltage ELVDD.

According to this embodiment, the fourth transistor T4 may further include an additional gate (a lower gate) that branches off from the first voltage line VL1 and that is disposed in a different layer from the gate electrode of the fourth transistor T4.

The one end of the capacitor Cst is connected with the gate electrode of the first transistor T1, and the opposite end of the capacitor Cst is connected with the second electrode of the first transistor T1. The structure of the pixel PXij according to an embodiment is not limited to the structure illustrated in FIG. 4. The number of transistors included in the pixel PXij, the number of capacitors included in the pixel PXij, and the connection relationship therebetween may be diversely modified.

Figure 5:
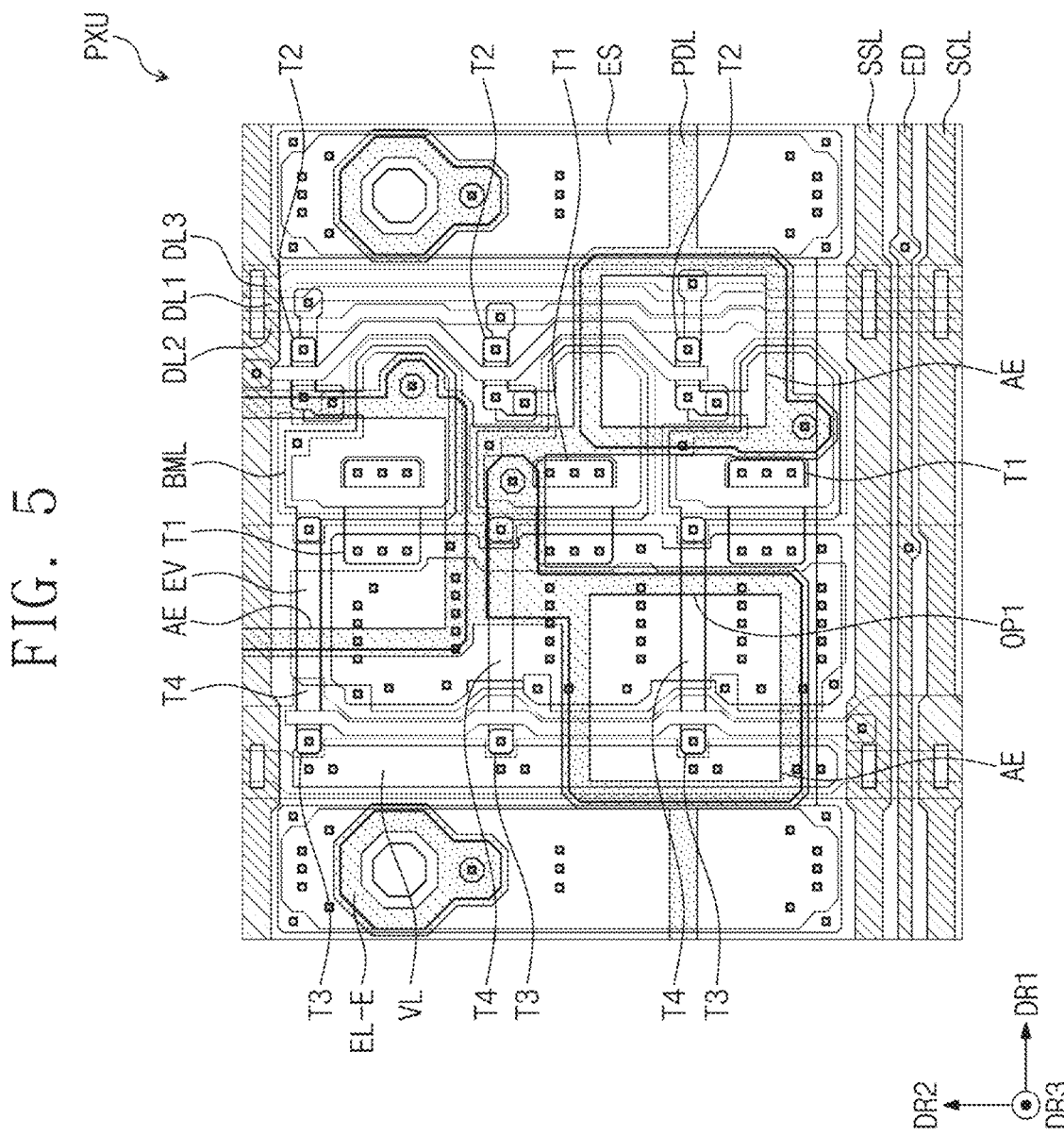
FIG. 5 is a plan view of an embodiment of a stacking sequence of conductive patterns included a unit pixel according to the disclosure.

FIG. 5 is a plan view of an embodiment of a stacking sequence of conductive patterns included a unit pixel according to the disclosure. FIGS. 6A to 6K are plan views illustrating an embodiment of layers according to the stacking sequence of the conductive patterns included in the unit pixel according to the disclosure. FIG. 7 is a cross-sectional view taken along line I-I' of FIG. 6K.

FIG. 5 illustrates an arrangement relationship between three pixels included in the unit pixel PXU (refer to FIG. 1A) and components included in a drive element, and FIGS. 6A to 6K illustrate layers that include the components illustrated in FIG. 5.

The pixels may be connected to corresponding data lines DL1, DL2, and DL3, respectively. Each of the pixels is connected to a power line ED, a first scan line SCL, a second scan line SSL, and an initialization voltage line VL. The power line ED may be connected to a first voltage line EV and a second voltage line ES. The first voltage line EV may provide a first voltage ELVDD to each of the pixels, and the second voltage line ES may provide a second voltage ELVSS (refer to FIG. 4) having a voltage level lower than that of the first voltage ELVDD to each of the pixels.

Each of the pixels according to the disclosure may include first to fourth transistors T1, T2, T3, and T4, a capacitor Cst (refer to FIG. 4), and a light-emitting element OLED (refer to FIG. 4). A first electrode AE included in each of the light-emitting elements OLED and a pixel defining film PDL are illustrated in FIG. 5.

An equivalent circuit diagram of the first to fourth transistors T1, T2, T3, and T4 and the capacitor Cst that are included in each of the pixels may correspond to the equivalent circuit diagram described with reference to FIG. 4.

The reference numerals of components disposed in different layers among the components illustrated in FIGS. 6A to 6K are described only on the corresponding layers, and omitted reference numerals will be described with reference to FIGS. 6A to 6K.

Figure 6A:
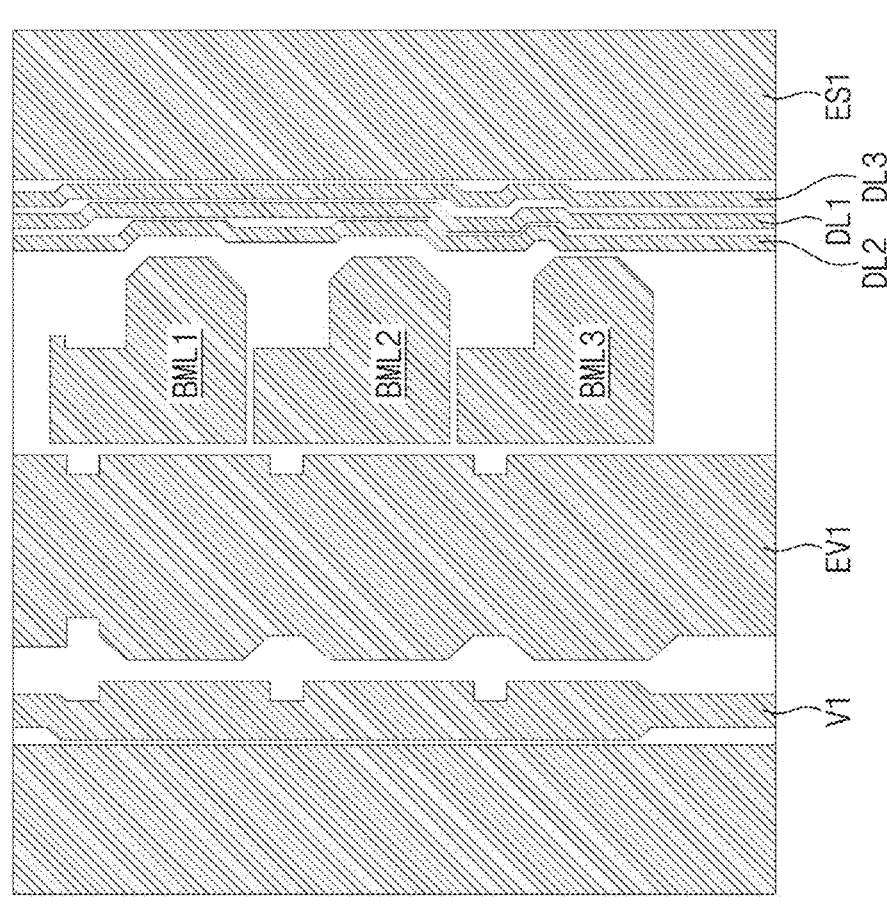
Figure 7:
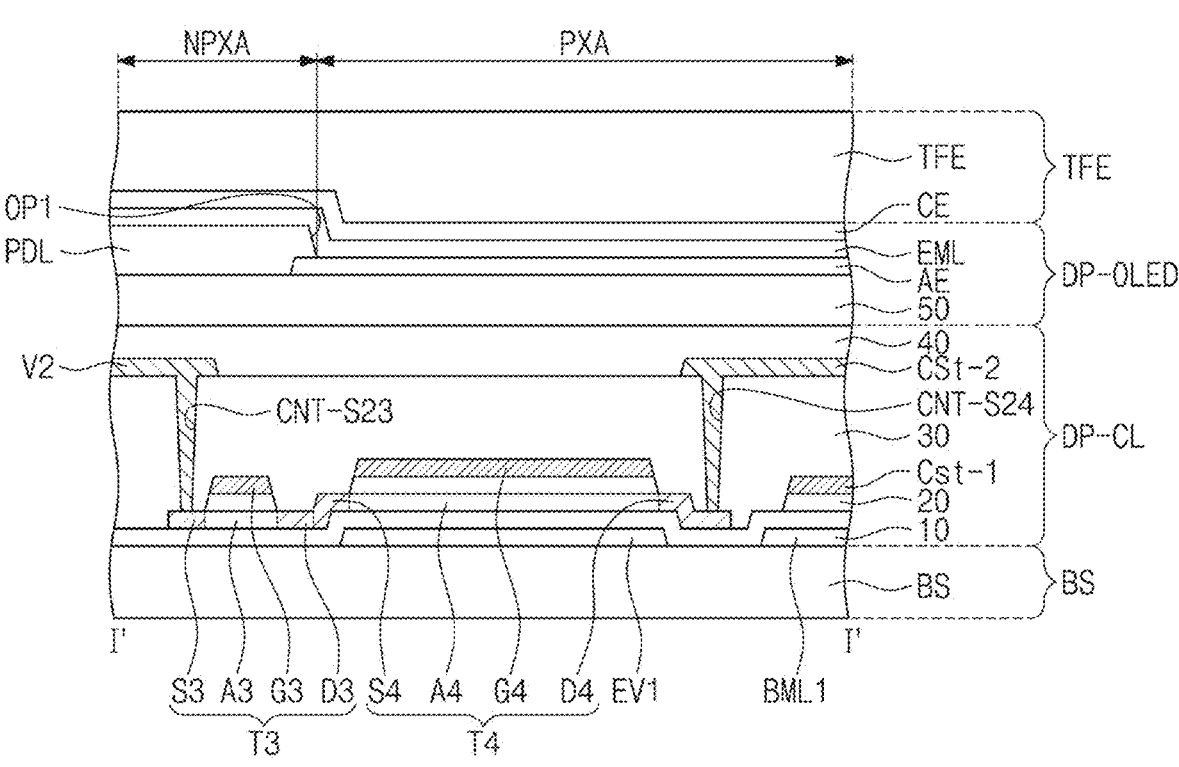
FIG. 7 is a cross-sectional view taken along line I-I' of FIG. 6K.

Referring to FIGS. 5 and 6A, a first conductive layer MSL1 according to the disclosure may include a first initialization line V1 of the initialization voltage line VL, a first pattern EV1 of the first voltage line EV, a light-blocking layer BML, the first to third data lines DL1, DL2, and DL3, and a first line ES1 of the second voltage line ES.

The first initialization line V1, the first pattern EV1 of the first voltage line EV, the first to third data lines DL1, DL2, and DL3, and the first line ES1 of the second voltage line ES may extend in the second direction DR2 and may be sequentially arranged in the first direction DR1 so as to be spaced apart from each other.

In this embodiment, the first pattern EV1 may be provided as an integral pattern that overlaps the three pixels. The first pattern EV1 may extend in the second direction DR2 to overlap non-illustrated pixels.

The light-blocking layer BML may be disposed between the first voltage line EV and the first to third data lines DL1, DL2, and DL3. The light-blocking layer BML may include first to third light-blocking patterns BML1, BML2, and BML3, each of which overlaps a corresponding one of the pixels. In an embodiment, each of the first to third light-blocking patterns BML1, BML2, and BML3 may be individually provided to partially overlap the semiconductor pattern of the first transistor T1 of a corresponding one of the pixels, for example.

According to an embodiment, each of the first to third light-blocking patterns BML1, BML2, and BML3 may be connected to the source S1 (refer to FIG. 6C) of the overlapping first transistor T1 and may receive a signal applied to the source S1 and form or constitute a sync structure under the semiconductor pattern.

The first to third data lines DL1, DL2, and DL3 may extend in the second direction DR2 and may be arranged in the first direction DR1 so as to be spaced apart from each other. Although FIG. 6A illustrates the second data line DL2, the first data line DL1, and the third data line DL3 sequentially arranged in the first direction DR1, the sequence in which the first to third data lines DL1, DL2, and DL3 are arranged in the first direction DR1 may be changed and is not limited to any particular embodiment.

The first conductive layer MSL1 may be covered by a first insulating layer 10. The first insulating layer 10 may be a buffer layer.

Figure 6B:
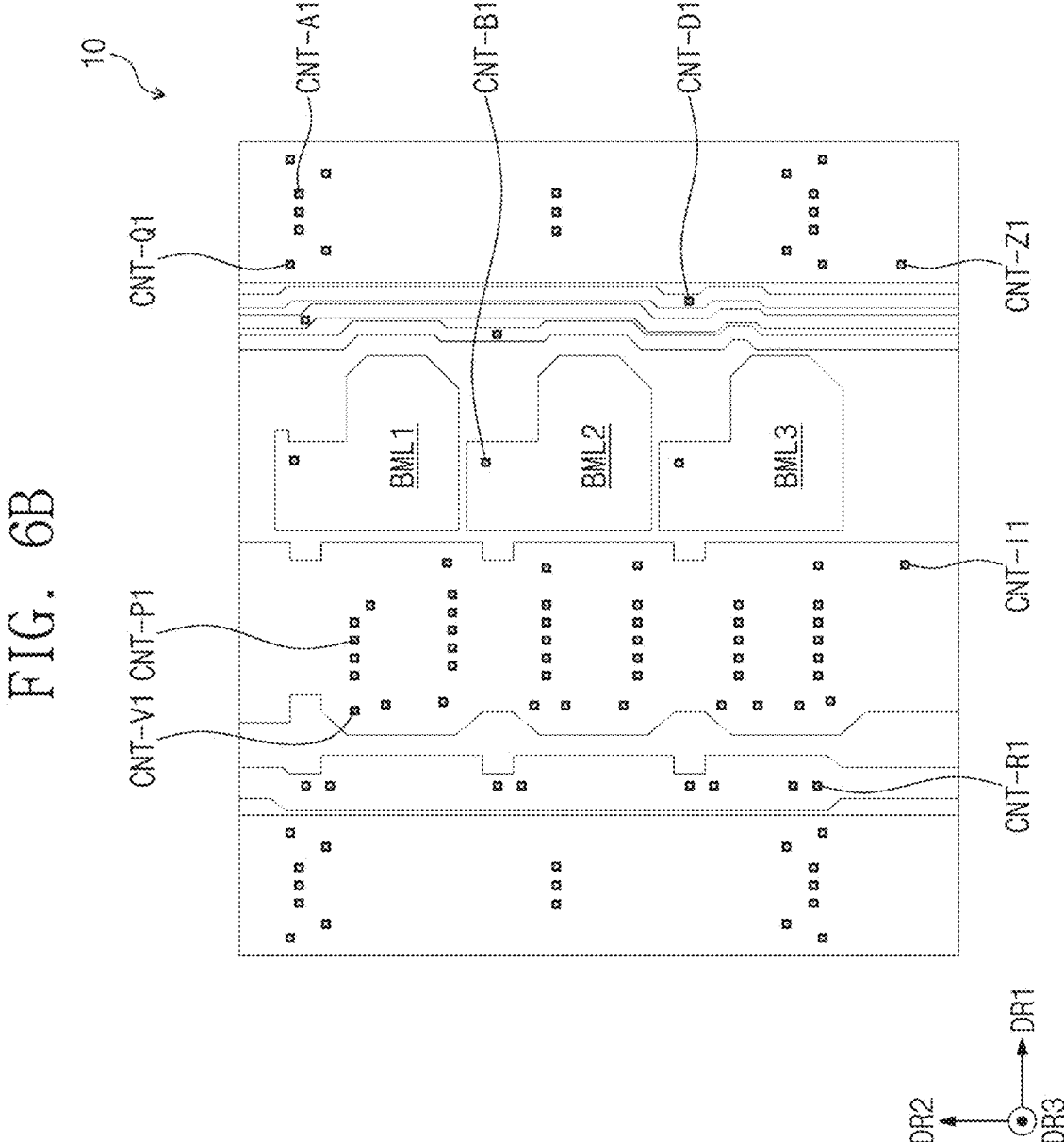

FIG. 6B illustrates contact holes defined in the first insulating layer 10. The first insulating layer 10 is disposed on the base layer BS (refer to FIG. 2) and covers the first conductive layer MSL1. A plurality of contact holes, each of which penetrates the first insulating layer 10 and exposes a portion of the first conductive layer MSL1, may be defined in the first insulating layer 10.

First initialization contact holes CNT-R1 may each expose a portion of the first initialization line V1.

Power contact holes CNT-P1, first second (1-2) power contact holes CNT-V1, and a first line contact hole CNT-I1 may each expose a portion of the first pattern EV1.

The first line contact hole CNT-I1 may expose a portion of the first pattern EV1.

First light-blocking contact holes CNT-B1 may each expose a portion of a corresponding one of the first to third light-blocking patterns BML1, BML2, and BML3.

First data contact holes CNT-D1 may each expose a portion of a corresponding one of the first to third data lines DL1, DL2, and DL3.

Additional contact holes CNT-A1, additional first second (1-2) contact holes CNT-Q1, and a first side contact hole CNT-Z1 may each expose a portion of the first line ES1.

Figure 6C:
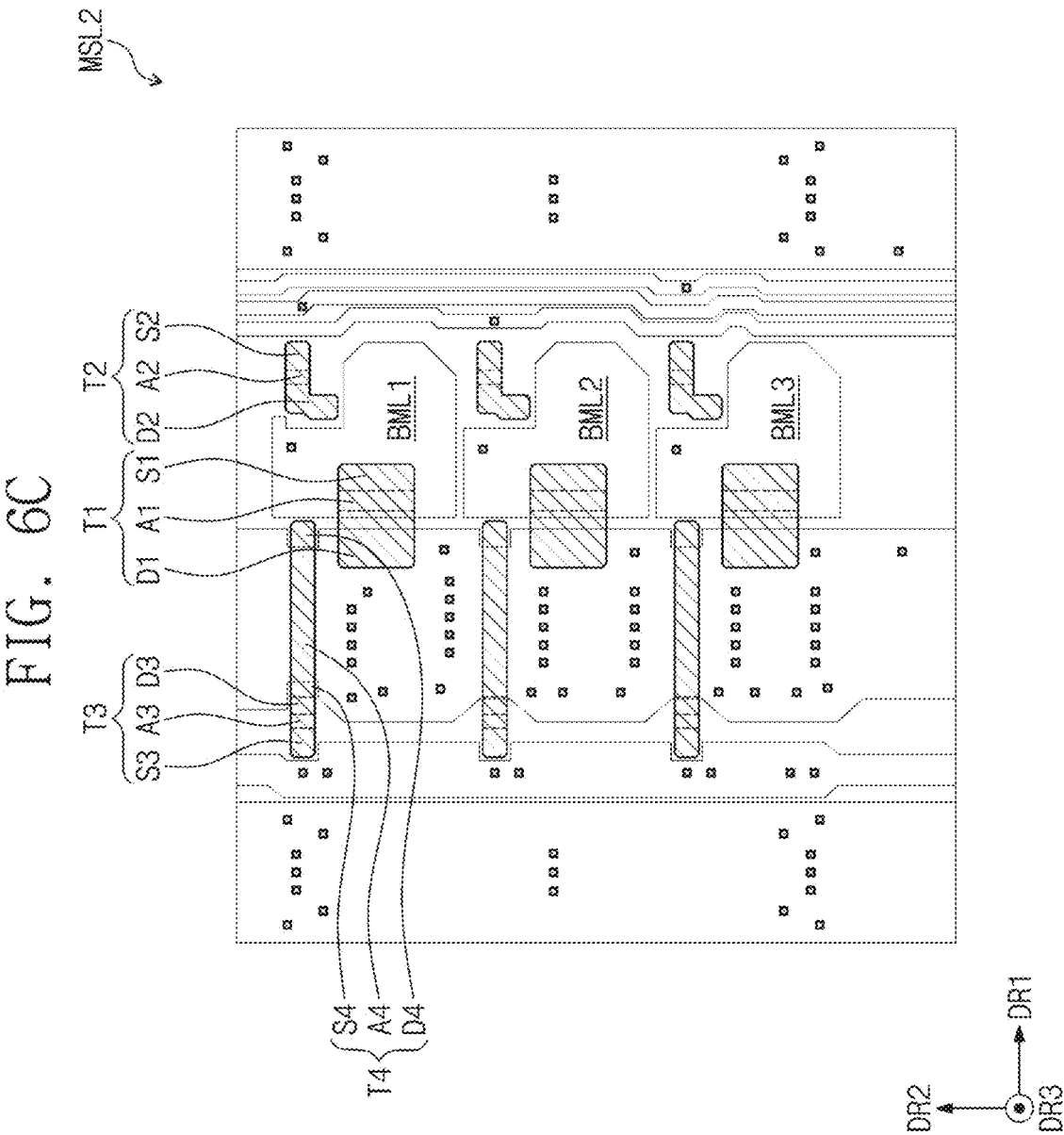

Referring to FIGS. 5 and 6C, a second conductive layer MSL2 according to the disclosure may be disposed on the first insulating layer 10. The second conductive layer MSL2 may include semiconductor patterns that are included in the first to fourth transistors T1, T2, T3, and T4, respectively.

The semiconductor pattern included in the first transistor T1 may include a first electrode S1, a second electrode D1, and a channel area A1. The channel area A1 may be disposed between the first electrode S1 and the second electrode D1. The semiconductor pattern included in the second transistor T2 may include a first electrode S2, a second electrode D2, and a channel area A2. The channel area A2 may be disposed between the first electrode S2 and the second electrode D2. The semiconductor pattern included in the third transistor T3 may include a first electrode S3, a second electrode D3, and a channel area A3. The channel area A3 may be disposed between the first electrode S3 and the second electrode D3. The semiconductor pattern included in the fourth transistor T4 may include a first electrode S4, a second electrode D4, and a channel area A4. The channel area A4 may be disposed between the first electrode S4 and the second electrode D4.

According to this embodiment, the first electrode S4 of the fourth transistor T4 may extend from the second electrode D3 of the third transistor T3. That is, the semiconductor pattern included in the third transistor T3 and the semiconductor pattern included in the fourth transistor T4 may form or constitute an integral pattern. The integral pattern may extend in the first direction DR1 between the first to third light-blocking patterns BML1, BML2, and BML3 corresponding to the first initialization line V1. In this case, a portion of the integral pattern may overlap the first pattern EV1. The portion overlapping the first pattern EV1 may constitute a double gate of the fourth transistor T4 as illustrated in FIG. 4.

The areas included in each of the semiconductor patterns may be divided into the first electrode, the second electrode, and the channel area after a reduction process is performed by, as a mask, a gate in a third conductive layer MSL3 (refer to FIG. 6D) to be described below.

The semiconductor patterns may each be an oxide semiconductor pattern. In an embodiment, an oxide semiconductor may include one of indium gallium zinc oxide ("IGZO") and indium tin zinc oxide ("ITZO"), for example. However, without being limited thereto, the semiconductor patterns may include amorphous silicon or polycrystalline silicon and are not limited to any particular embodiment.

FIG. 6D illustrates contact holes defined in a second insulating layer 20. The second insulating layer 20 is disposed on the first insulating layer 10 and covers a portion of the second conductive layer MSL2. A plurality of contact holes, each of which penetrates the second insulating layer 20 and exposes a portion of the second conductive layer MSL2, may be defined in the second insulating layer 20.

A first gate contact hole CNT-T1 may expose part of a portion protruding from the second electrode D2 included in the second transistor T2.

According to the disclosure, after the contract holes are defined in the second insulating layer 20, conductive patterns are formed by making the third conductive layer MSL3 on the second insulating layer 20 subject to patterning. Thereafter, the second insulating layer 20 may be removed with the conductive patterns in the third conductive layer MSL3 as masks.

Accordingly, in the disclosure, the shape of the second insulating layer 20 in the plan view may correspond to the shape of the conductive patterns of the third conductive layer MSL3, except for the contact holes defined in the second insulating layer 20. When the shape of the second insulating layer 20 corresponds to the shape of the conductive patterns of the third conductive layer MSL3, this does not mean that the second insulating layer 20 and the conductive patterns of the third conductive layer MSL3 have the same area in the plan view and may include a process error.

Figure 6E:
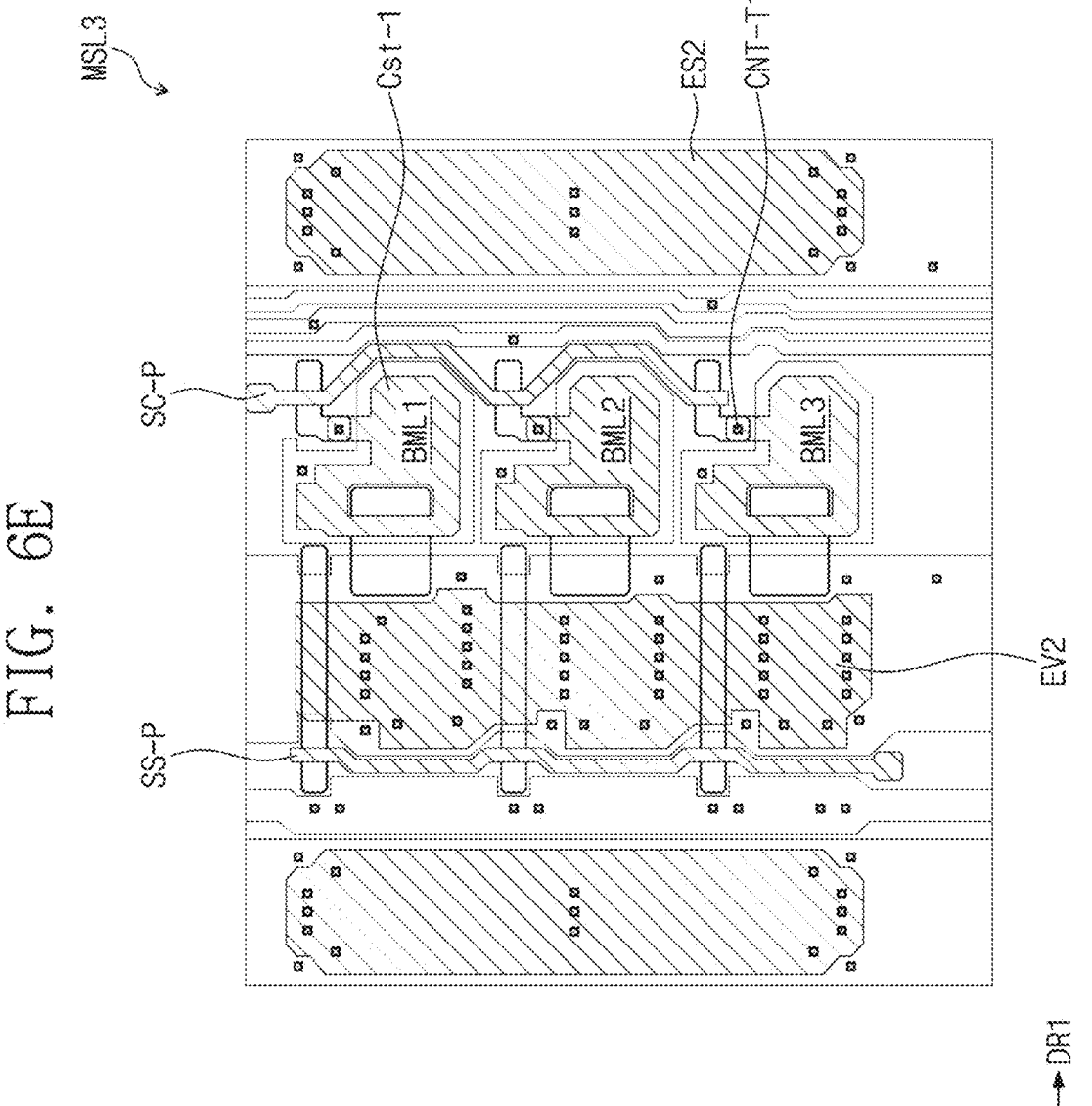

Referring to FIGS. 5 and 6E, the third conductive layer MSL3 may be disposed on the second insulating layer 20. The third conductive layer MSL3 may include a sensing pattern SS-P connected with the second scan line SSL of a fourth conductive layer MSL4, a scan pattern SC-P connected with the first scan line SCL of the fourth conductive layer MSL4, and a first portion Cst-1 of the capacitor Cst.

The third conductive layer MSL3 may include a second pattern EV2 of the first voltage line EV. The second pattern EV2 may extend in the second direction DR2 and may be provided as an integral pattern that overlaps the three pixels. The portion of the second pattern EV2 that overlaps the first pattern EV1 may be disposed in the first (1-1) power contact holes CNT-P1 and may be connected with the first pattern EV1.

The third conductive layer MSL3 may include a second line ES2 of the second voltage line ES. The second line ES2 may overlap the first line ES1. The second line ES2 may extend in the second direction DR2. The first line ES1 and the second line ES2 may be spaced apart from the data lines DL1, DL2, and DL3 in the plan view. The second line ES2 may be disposed in the additional first first (1-1) contact holes CNT-A1 and may be connected with the first line ES1.

According to the disclosure, the third conductive layer MSL3 may include gates that are included in the first to fourth transistors T1, T2, T3, and T4, respectively.

The portion of the third conductive layer MSL3 that overlaps the channel area A1 of the first transistor T1 may be defined as the gate G1 of the first transistor T1, and the remaining portion may be defined as the first portion Cst-1 of the capacitor Cst. The first portion Cst-1 may be disposed in the first gate contact hole CNT-T1 and may be connected with the portion protruding from the second electrode D2 of the second transistor T2.

The scan pattern SC-P that overlaps the channel area A2 of the second transistor T2 may be defined as the gate G2 of the second transistor T2, and the sensing pattern SS-P that overlaps the channel area A3 of the third transistor T3 may be defined as the gate G3 of the third transistor T3.

In this embodiment, the portion of the second pattern EV2 that overlaps the channel area A4 of the fourth transistor T4 may be defined as the gate G4 (the upper gate) of the fourth transistor T4. Accordingly, the gate G4 of the fourth transistor T4 may be disposed in the same layer as the gates included in the first to third transistors T1, T2, and T3.

A reduction process may be performed on the semiconductor patterns included in the first to fourth transistors T1, T2, T3, and T4 with the gates G1, G2, G3, and G4 as masks, and in each of the first to fourth transistors T1, T2, T3, and T4, the first electrode and the second electrode may have a higher conductivity than that of the channel area.

The sensing pattern SS-P may be connected with the second scan line SSL that is formed or disposed in the fourth conductive layer MSL4 to be described below and that extends in the first direction DR1. The sensing pattern SS-P may extend in the second direction DR2 between the light-blocking patterns BML1, BML2, and BML3 and the data lines DL1, DL2, and DL3.

The scan pattern SC-P may be connected with the first scan line SCL that is formed or disposed in the fourth conductive layer MSL4 to be described below and that extends in the first direction DR1. The scan pattern SC-P may extend in the second direction DR2 between the first initialization line V1 and the second pattern EV2.

The third conductive layer MSL3 may be covered by a third insulating layer 30.

Figure 6F:
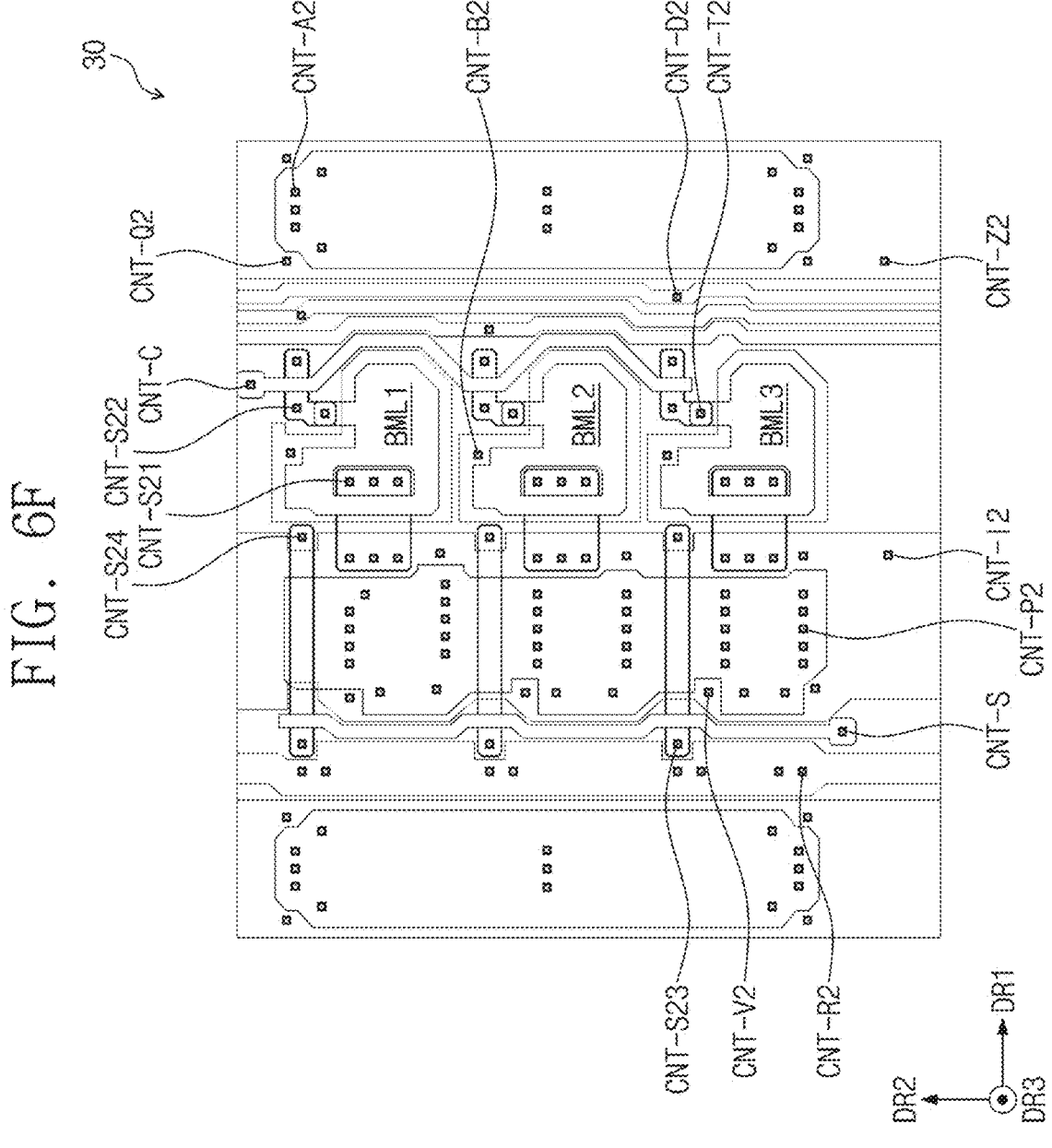

FIG. 6F illustrates contact holes defined in the third insulating layer 30. The third insulating layer 30 is disposed on the second insulating layer 20 and covers the third conductive layer MSL3. A plurality of contact holes, each of which penetrates the third insulating layer 30 and exposes a portion of the third conductive layer MSL3, may be defined in the third insulating layer 30.

Second initialization contact holes CNT-R2 may overlap the first initialization contact holes CNT-R1. The second initialization contact holes CNT-R2 and the first initialization contact holes CNT-R1 may each expose a portion of the first initialization line V1.

A sensing contact hole CNT-S may expose a portion of the sensing pattern SS-P. A scan contact hole CNT-C may expose a portion of the scan pattern SC-P.

Second first (2-1) power contact holes CNT-P2 may overlap the first first (1-1) power contact holes CNT-P1. The second first (2-1) power contact holes CNT-P2 and the first first (1-1) power contact holes CNT-P1 may each expose a portion of the first pattern EV1.

Second second (2-2) power contact holes CNT-V2 may overlap the first second (1-2) power contact holes CNT-V1. The second second (2-2) power contact holes CNT-V2 and the first second (1-2) power contact holes CNT-V1 may each expose a portion of the first pattern EV1.

A second line contact hole CNT-I2 may overlap the first line contact hole CNT-I1. The second line contact hole CNT-I2 and the first line contact hole CNT-I1 may each expose a portion of the first pattern EV1.

A second light-blocking contact hole CNT-B2 may overlap the first light-blocking contact hole CNT-B1. The second light-blocking contact hole CNT-B2 and the first light-blocking contact hole CNT-B1 may expose the corresponding light-blocking patterns BML1, BML2, and BML3.

A second gate contact hole CNT-T2 may expose a portion of the first portion Cst-1 of the capacitor Cst.

Second data contact holes CNT-D2 may overlap the first data contact holes CNT-D1. The second data contact holes CNT-D2 and the first data contact holes CNT-D1 may each expose a portion of a corresponding one of the first to third data lines DL1, DL2, and DL3.

Additional second first (2-1) contact holes CNT-A2 may overlap the additional first first (1-1) contact holes CNT-A1.

The additional second first (2-1) contact holes CNT-A2 may each expose a portion of the second line ES2.

Additional second second (2-2) contact holes CNT-Q2 may overlap the additional first second (1-2) contact holes CNT-Q1. The additional second second (2-2) contact holes CNT-Q2 and the additional first second (1-2) contact holes CNT-Q1 may each expose a portion of the first line ES1.

A second side contact hole CNT-Z2 may overlap the first side contact hole CNT-Z1. The second side contact hole CNT-Z2 and the first side contact hole CNT-Z1 may each expose a portion of the first line ES1.

Second first (2-1) semiconductor contact holes CNT-S21 may expose a portion of the first electrode S1 and a portion of the second electrode D1 of the first transistor T1.

Second second (2-2) semiconductor contact holes CNT-S22 may expose a portion of the first electrode S2 and a portion of the second electrode D2 of the second transistor T2.

Second third (2-3) semiconductor contact holes CNT-S23 may expose a portion of the first electrode S3 of the third transistor T3.

Second fourth (2-4) semiconductor contact holes CNT-S24 may expose a portion of the second electrode D4 of the fourth transistor T4.

Figure 6G:
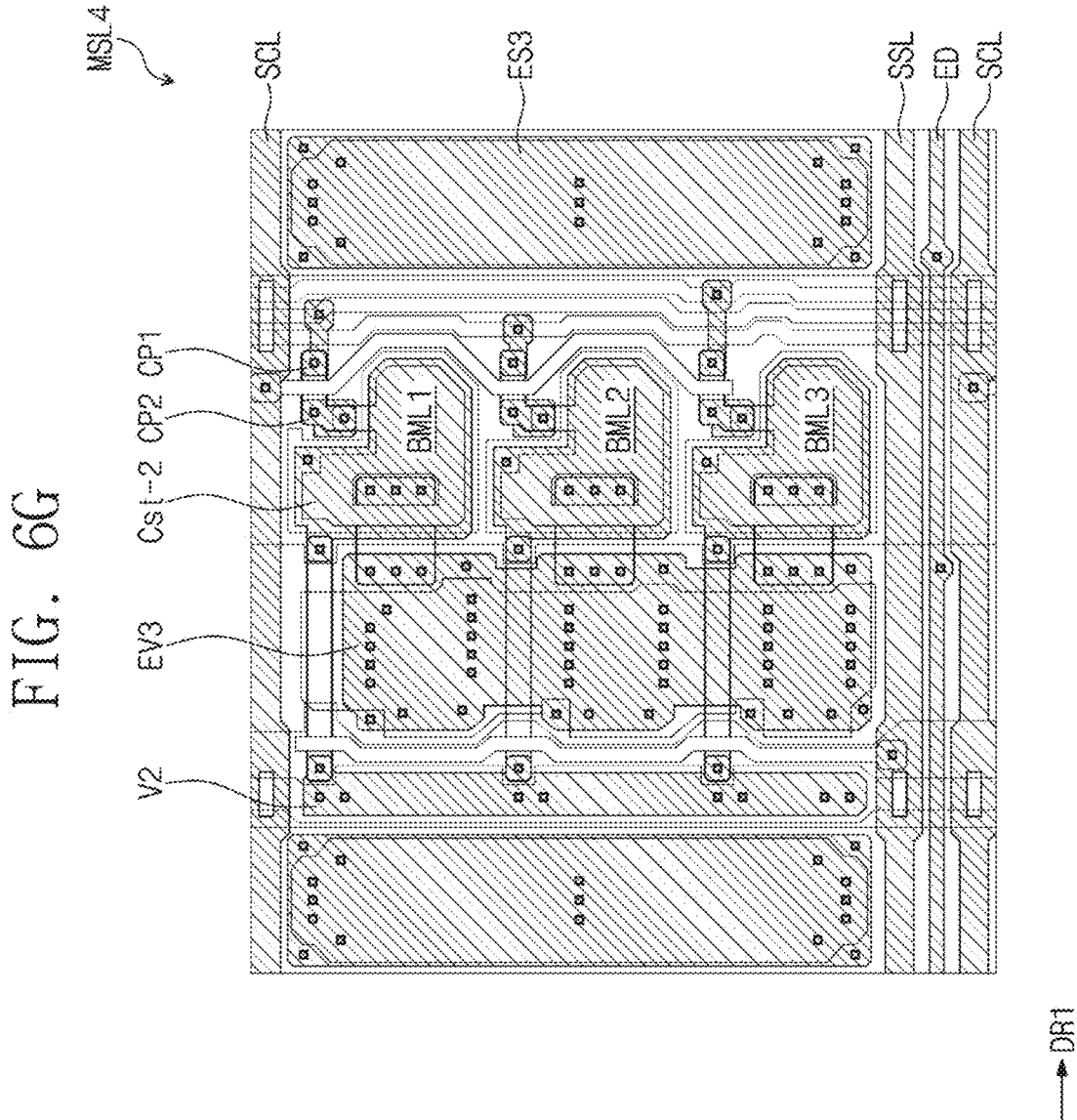

Referring to FIGS. 5 and 6G, the fourth conductive layer MSL4 may be disposed on the third insulating layer 30. The fourth conductive layer MSL4 may include the first scan line SCL, the second scan line SSL, a first sub-pattern CP1, a second sub-pattern CP2, a second initialization line V2, and a second portion Cst-2 of the capacitor Cst.

The fourth conductive layer MSL4 may include a third line ES3 of the second voltage line ES. The third line ES3 may overlap the first line ES1 and the second line ES2 and may extend in the second direction DR2.

The third line ES3 may be disposed in the additional second first (2-1) contact holes CNT-A2 and may be connected with the second line ES2. The third line ES3 may be connected with the first line ES1 through the additional first second (1-2) contact holes CNt-Q1 and the additional second second (2-2) contact holes CNT-Q2. Accordingly, the second voltage line ES that provides the second voltage ELVSS according to this embodiment may have a tripe structure in which patterns disposed in different layers are connected together. Thus, the display panel DP according to the disclosure may include the low-resistance second voltage line ES.

The first scan line SCL may be connected with the scan pattern SC-P through the scan contact hole CNT-C. In FIG. 6G, for convenience of description, the first scan line SCL disposed at the top is illustrated as being connected with the scan pattern SC-P through the scan contact hole CNT-C. However, a connection relationship between the first scan line SCL disposed at the bottom and the scan pattern SC-p may be the same as the connection relationship between the first scan line SCL at the top and the scan pattern SC-P.

The second scan line SSL may be connected with the sensing pattern SS-P through the sensing contact hole CNT-S.

The power line ED may be connected with the first pattern EV1 through the first line contact hole CNT-I1 and the second line contact hole CNT-12, and the power line ED may be connected with the first line ES1 through the first side contact hole CNT-Z1 and the second side contact hole CNT-Z2.

The first scan line SCL, the second scan line SSL, and the power line ED may extend in the first direction DR1. The first scan line SCL, the power line ED, and the second scan line SSL may be sequentially arranged in the second direction DR2 so as to be spaced apart from each other.

The first sub-pattern CP1 may connect the second transistor T2 and a corresponding one of the data lines DL1, DL2, and DL3.

One end of the first sub-pattern CP1 may overlap the first electrode S2 of the second transistor T2 and may be disposed in the contact hole overlapping the first electrode S2 of the second transistor T2 among the second second (2-2) semiconductor contact holes CNT-S22. An opposite end of the first sub-pattern CP1 may extend to the corresponding data line and may be disposed in the first data contact hole CNT-D1 and the second data contact hole CNT-D2 and connected with the corresponding data line. Accordingly, the second transistor T2 and the data line may be connected through the first sub-pattern CP1.

One end of the second sub-pattern CP2 may overlap the second electrode D2 of the second transistor T2 and may be disposed in the contact hole overlapping the second electrode D2 of the second transistor T2 among the second second (2-2) semiconductor contact holes CNT-S22. An opposite end of the second sub-pattern CP2 may overlap the first portion Cst-1 of the capacitor Cst and may be disposed in the second gate contact hole CNT-T2.

The second initialization line V2 may overlap the first initialization line V1. The second initialization line V2 may be connected with the first initialization line V1 through the first and second initialization contact holes CNT-R1 and CNT-R2.

One portion of the second portion Cst-2 of the capacitor Cst may be disposed in the first light-blocking contact hole CNT-B1 and the second light-blocking contact hole CNT-B2 and connected with a corresponding light-blocking pattern.

One portion of the second portion Cst-2 of the capacitor Cst may be disposed in the contact hole overlapping the first electrode S1 of the first transistor T1 among the second first (2-1) semiconductor contact holes CNT-S21 and may be connected with the first electrode S1 of the first transistor T1.

One portion of the second portion Cst-2 of the capacitor Cst may overlap the second electrode D4 of the fourth transistor T4. The second portion Cst-2 may be disposed in the second fourth (2-4) semiconductor contact hole CNT-S24 and may connect the fourth transistor T4 and the first transistor T1.

In this embodiment, as the first electrode S4 of the fourth transistor T4 forms or constitutes an integral pattern with the second electrode D3 of the third transistor T3 and the second electrode D4 of the fourth transistor T4 is connected with the first transistor T1, the fourth transistor T4 may be provided in the state of being turned on by the first voltage ELVDD continuously applied thereto. Resistance may increase due to the fourth transistor T4 to cause a difference in the initialization voltage VINT. However, the difference is able to be compensated for by changing the range of the drive voltage, such as changing the range of the initialization voltage or changing the range of the data voltage.

According to this embodiment, the fourth conductive layer MSL4 may include a third pattern EV3 of the first voltage line EV. The third pattern EV3 may extend in the second direction DR2 and may be provided as an integral pattern that overlaps the three pixels. The third pattern EV3 may overlap the first pattern EV1 and the second pattern EV2.

The third pattern EV3 may be connected with the first pattern EV1 and the second pattern EV2 through the first first (1-1) power contact holes CNT-P1 and the second first (2-1) power contact holes CNT-P2, and the third pattern EV3 may be directly connected with the first pattern EV1 through the power contact holes 1-2 CNT-V1 and the second second (2-2) power contact holes CNT-V2.

Accordingly, the first voltage line EV that provides the first voltage ELVDD according to this embodiment may have a tripe structure in which patterns disposed in different layers are connected together. As the first pattern EV1, the second pattern EV2, and the third pattern EV3 extend in the second direction DR2 in the first voltage line EV having the triple structure and overlap the three pixels, the path connected through the contact holes may be decreased, compared to that in a triple structure in which any one layer includes floated patterns spaced apart from each other in the second direction DR2. Thus, the resistance of the first voltage line EV may be efficiently reduced.

Figure 6H:
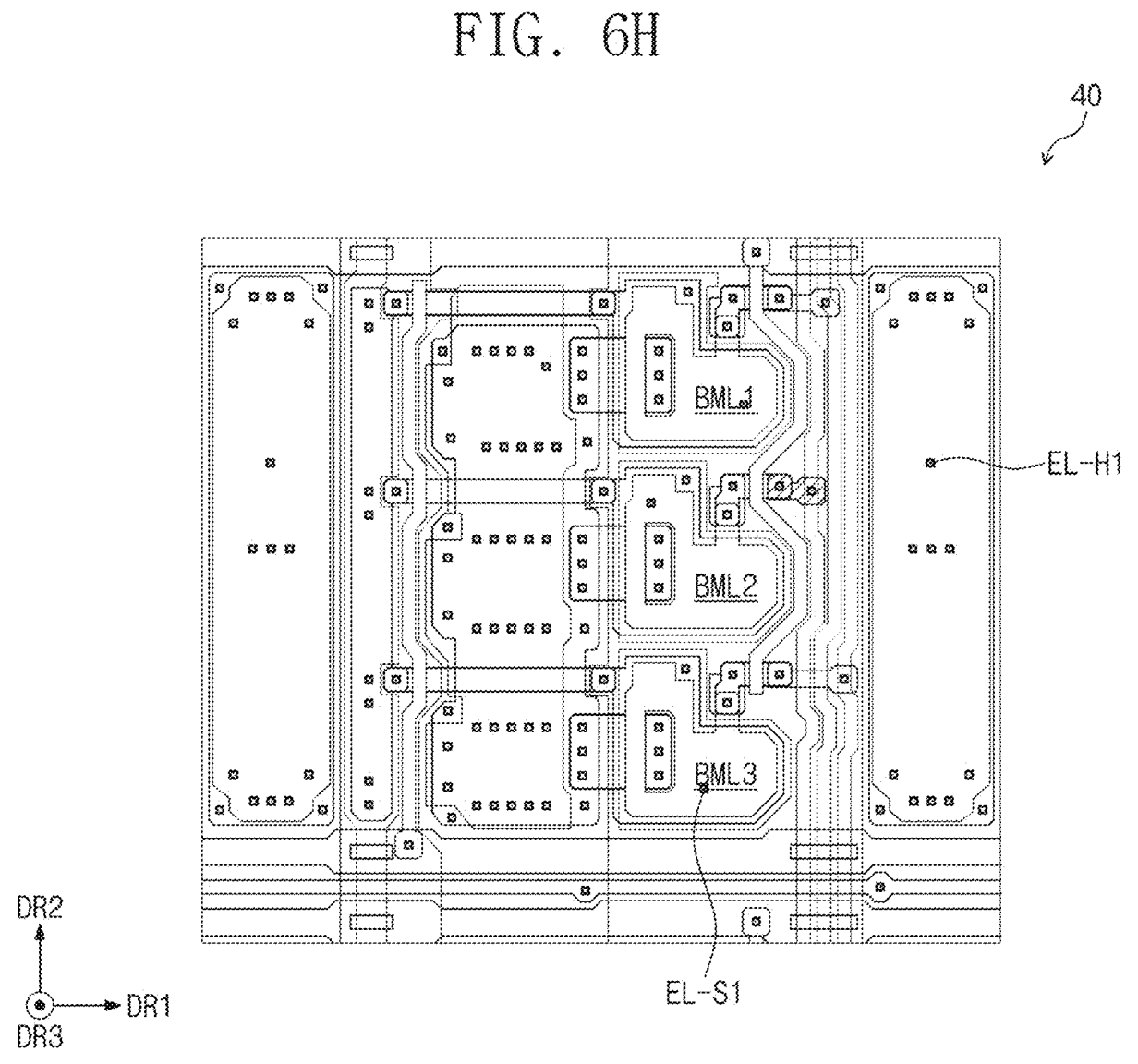

FIG. 6H illustrates contact holes defined in a fourth insulating layer 40. The fourth insulating layer 40 is disposed on the third insulating layer 30 and covers the fourth conductive layer MSL4. A plurality of contact holes, each of which penetrates the fourth insulating layer 40 and exposes a portion of the fourth conductive layer MSL4, may be defined in the fourth insulating layer 40.

A first via contact hole EL-H1 may expose a portion of the third line ES3 of the power line ED.

A first anode contact hole EL-S1 may expose a portion of the second portion Cst-2 of the capacitor Cst.

FIG. 6I illustrates contact holes defined in a fifth insulating layer 50. The fifth insulating layer 50 may be disposed on the fourth insulating layer 40. A plurality of contact holes that penetrate the fifth insulating layer 50 and overlap the contact holes defined in the fourth insulating layer 40 may be defined in the fifth insulating layer 50.

A second via contact hole EL-H2 may overlap the first via contact hole EL-H1. The second via contact hole EL-H2 may have a larger area than that of the first via contact hole EL-H1. The first via contact hole EL-H1 and the second via contact hole EL-H2 may expose a portion of the third line ES3 of the power line ED.

A second anode contact hole EL-S2 may overlap the first anode contact hole EL-S1. The first anode contact hole EL-S1 and the second anode contact hole EL-S2 may expose a portion of the second portion Cst-2 of the capacitor Cst.

A via hole VIA-H may overlap a portion of the third line ES3 of the power line ED. The first electrode AE and a second electrode CE (refer to FIG. 7) of the light-emitting element OLED may be connected through the via hole VIA-H.

According to an embodiment, one of the fourth insulating layer 40 and the fifth insulating layer 50 may be omitted. Accordingly, the fourth insulating layer 40 and the fifth insulating layer 50 may be provided as one insulating layer, and the contact holes defined in the fourth insulating layer 40 and the contact holes defined in the fifth insulating layer 50 may be defined in the one insulating layer. However, the disclosure is not limited to any particular embodiment.

FIG. 6J illustrates the first electrodes AE included in the light-emitting elements OLED (refer to FIG. 4) of the respective pixels and an electrode pattern EL-E. A conductive layer AEL including the first electrodes AE and the electrode pattern EL-E may be disposed on the fifth insulating layer 50.

The first electrode AE may be disposed in the first anode contact hole EL-S1 and the second anode contact hole EL-S2 and may be connected with the second portion Cst-2 of the capacitor Cst.

The areas of the first electrodes AE included in the pixels that provide different light may differ from one another. In an embodiment, the area of the first electrode AE included in the pixel that provides light having a second color may be smaller than that of the area of the first electrode AE included in the pixel that provides light having a first color and may be larger than that of the area of the first electrode AE included in the pixel that provides light having a third color, for example. The first color may be green, the second color may be red, and the third color may be blue.

However, without being limited thereto, the first electrodes AE may have the same area. Furthermore, the colors of light provided depending on the areas of the first electrodes AE may vary depending on the qualities of the pixels and are not limited to any particular embodiment.

The electrode pattern EL-E may be disposed in the first via contact hole EL-H1 and the second via contact hole EL-H2 and may be connected with the third line ES3 of the power line ED.

Figure 6K:
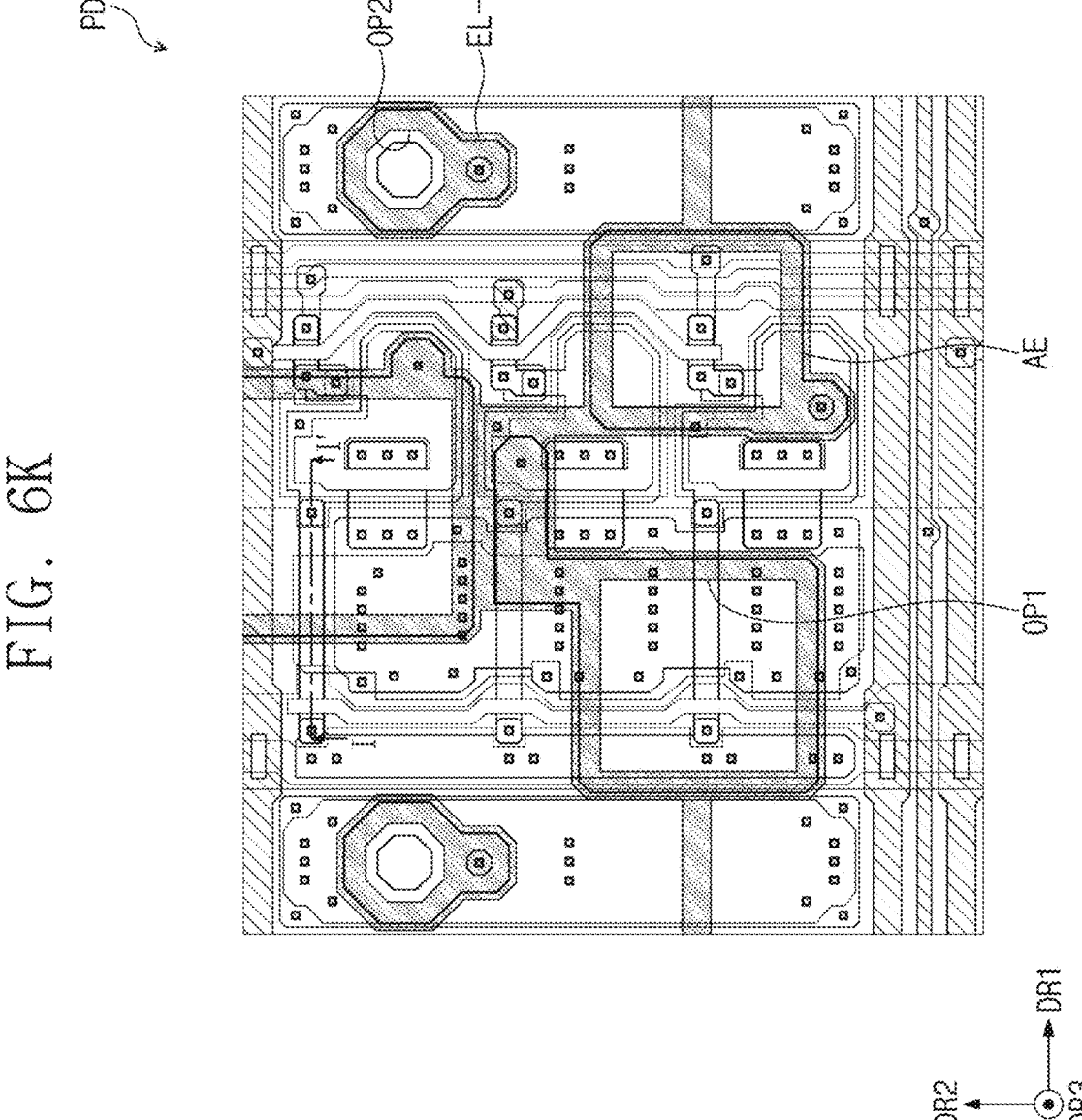

FIG. 6K illustrates the pixel defining film PDL. The pixel defining film PDL may be disposed on the fifth insulating layer 50, and a first opening OP1 and a second opening OP2 may be defined in the pixel defining film PDL. The first opening OP1 may expose at least a portion of the first electrode AE, and the second opening OP2 may expose at least a portion of the electrode pattern EL-E.

The area of the first electrode AE exposed by the first opening OP1 may be defined as the emissive area PXA (refer to FIG. 7) through which light generated from the light-emitting element OLED is substantially provided, and the area of the first electrode AE that overlaps the pixel defining film PDL may be defined as the non-emissive area NPXA (refer to FIG. 7).

Referring to FIG. 7, the display panel DP may include the base layer BS, and the circuit element layer DP-CL, the display element layer DP-OLED, and the thin film encapsulation layer TFE that are disposed on the base layer BS. In FIG. 7, the window panel WD and the light control layer OSL described above with reference to FIG. 2 are omitted.

The circuit element layer DP-CL may include the first to fifth insulating layers 10, 20, 30, 40, and 50 and the first to fourth conductive layers MSL1, MSL2, MSL3, and MSL4. According to an embodiment, the first to fifth insulating layers 10, 20, 30, 40, and 50 may include one of an inorganic layer and an organic layer.

The first to fifth insulating layers 10, 20, 30, 40, and 50 and the pixel defining film PDL may correspond to the insulating layers described above with reference to FIGS. 6B, 6D, 6F, 6H, 6I, and 6K, and the first to fourth conductive layers MSL1, MSL2, MSL3, and MSL4 may correspond to the conductive layers described above with reference to FIGS. 6A, 6C, 6E, and 6G.

The display element layer DP-OLED may include the light-emitting element OLED and the pixel defining film PDL. The light-emitting element OLED may include the first electrode AE, an emissive layer EML, and the second electrode CE. The light-emitting element OLED according to an embodiment may further include a hole control layer and an electron control layer.

The first electrode AE of the light-emitting element OLED is disposed on the fifth insulating layer 50. The first electrode AE may be an anode. The first electrode AE included in each of the pixels may correspond to the first electrode AE described above with reference to FIG. 6J.

The pixel defining film PDL is disposed on the fifth insulating layer 50. The first opening OP1 of the pixel defining film PDL exposes at least a portion of the first electrode AE. The first opening OP1 of the pixel defining film PDL may be defined as the emissive area PXA through which light is substantially provided. The area around the emissive area PXA may be defined as the non-emissive area NPXA.

The emissive layer EML is disposed on the first electrode AE. The emissive layer EML may overlap the first opening OP1. The emissive layer EML may overlap the emissive area PXA of an adjacent pixel. In an embodiment, the emissive layer EML may have an integral shape commonly provided for the pixels included in the unit pixel PXU described above with reference to FIGS. 1A and 1B, for example. The commonly disposed emissive layer EML may generate white light or blue light. Furthermore, the emissive layer EML may have a multi-layer structure. However, without being limited thereto, an emissive layer according to an embodiment may be separately patterned and provided for each of the plurality of pixels PX. The second electrode CE is disposed on the emissive layer EML. The second electrode CE is commonly disposed for the plurality of pixels PX.

The second electrode CE may be disposed in the via hole VIA-H and may be connected with the electrode pattern EL-E. Accordingly, the second electrode CE may commonly provide the first voltage ELVDD to the pixels.

The thin film encapsulation layer TFE is disposed on the second electrode CE. The thin film encapsulation layer TFE is commonly disposed for the plurality of pixels PX. In this embodiment, the thin film encapsulation layer TFE directly covers the second electrode CE.

The thin film encapsulation layer TFE includes one or more inorganic layers and an organic layer. In an embodiment, the thin film encapsulation layer TFE may include two inorganic layers and an organic layer disposed therebetween, for example.

The inorganic layers may include a silicon nitride layer, a silicon oxy-nitride layer, a silicon oxide layer, a titanium oxide layer, or an aluminum oxide layer. The organic layer may include, but is not limited to, an acryl-based organic layer.

The first pattern EV1 and the first light-blocking pattern BML1 are disposed on the base layer BS.

The first insulating layer 10 may be disposed on the base layer BS and may cover the first pattern EV1 and the first light-blocking pattern BML1.

The first electrode S3, the channel area A3, and the second electrode D3 of the third transistor T3 may be disposed on the first insulating layer 10.

The first electrode S4, the channel area A4, and the second electrode D4 of the fourth transistor T4 may be disposed on the first insulating layer 10. The first electrode S4 of the fourth transistor T4 may extend from the second electrode D3 of the third transistor T3.

According to an embodiment, the channel area A4 may overlap the first pattern EV1. The portion of the first pattern EV1 that overlaps the channel area A4 may be the lower gate of the fourth transistor T4 illustrated in FIG. 4.

The second insulating layer 20 is disposed on the first insulating layer 10. The shape of the second insulating layer 20 may correspond to the gate G3 of the third transistor T3, the gate G4 of the fourth transistor T4, and the first portion Cst-1 of the capacitor Cst.

The gate G3 of the third transistor T3, the gate G4 of the fourth transistor T4, and the first portion Cst-1 of the capacitor Cst may be disposed on the patterned second insulating layer 20. The gate G3 of the third transistor T3 and the gate G4 of the fourth transistor T4 may include the same material.

The third insulating layer 30 may be disposed on the second insulating layer 20 and may cover the gate G3 of the third transistor T3, the gate G4 of the fourth transistor T4, and the first portion Cst-1 of the capacitor Cst.

The second third (2-3) semiconductor contact hole CNT-S23 and the second fourth (2-4) semiconductor contact hole CNT-S24 may be defined in the third insulating layer 30. The second third (2-3) semiconductor contact hole CNT-S23 may expose the first electrode S3 of the third transistor T3, and the second fourth (2-4) semiconductor contact hole CNT-S24 may expose the second electrode D4 of the fourth transistor T4.

The second initialization line V2 and the second portion Cst-2 of the capacitor Cst may be disposed. The second initialization line V2 may be disposed in the second third (2-3) semiconductor contact hole CNT-S23 and may be connected with the first electrode S3 of the third transistor T3, and the second portion Cst-2 of the capacitor Cst may be disposed in the second fourth (2-4) semiconductor contact hole CNT-S24 and may be connected with the second electrode D4 of the fourth transistor T4.

The fourth insulating layer 40 may be disposed on the third insulating layer 30 and may cover the second initialization line V2 and the second portion Cst-2 of the capacitor Cst. Although not illustrated, the first anode contact hole EL-S1 exposing a portion of the second portion Cst-2 of the capacitor Cst may be defined in the fourth insulating layer 40.

The fifth insulating layer 50 may be disposed on the fourth insulating layer 40, and the second anode contact hole EL-S2 overlapping the first anode contact hole EL-S1 may be defined in the fifth insulating layer 50.

The first electrode AE may be disposed in the first anode contact hole EL-S1 and the second anode contact hole EL-S2 and may be connected with the second portion Cst-2 of the capacitor Cst.

Figure 8:
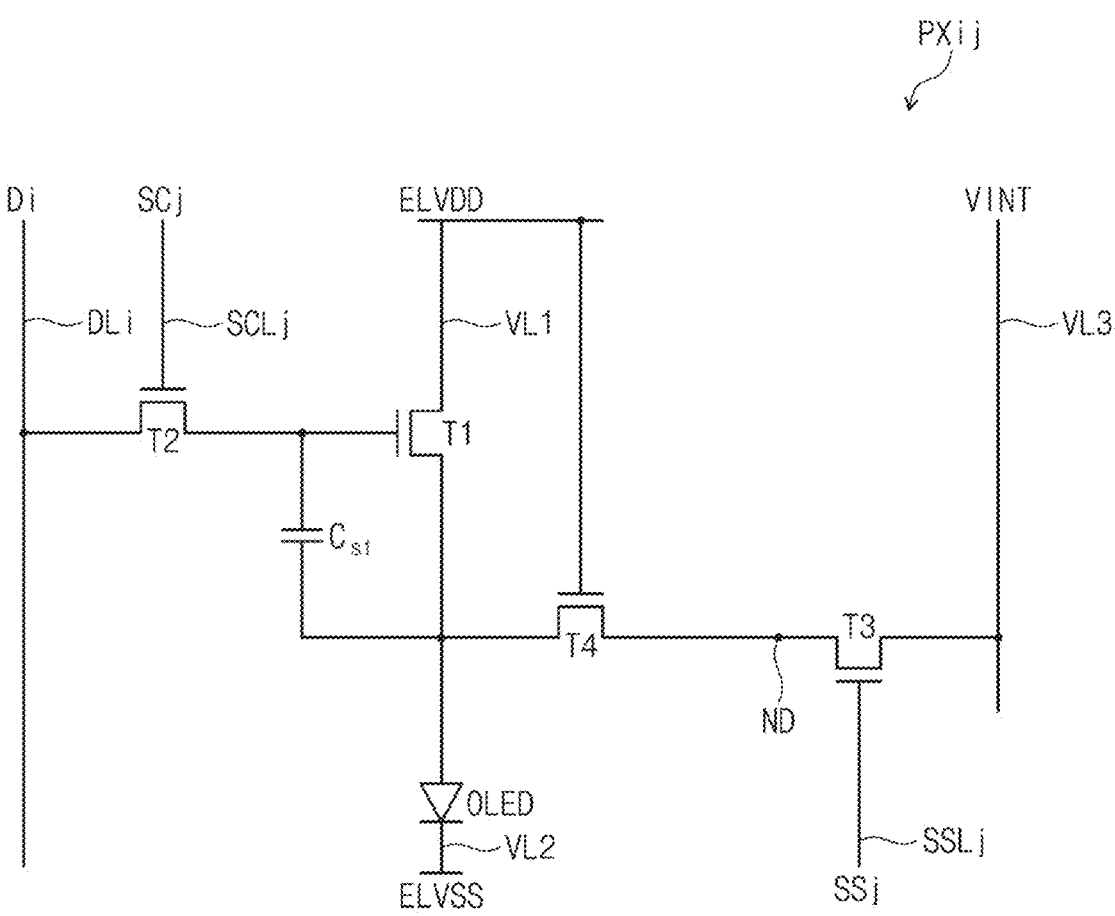
FIG. 8 is an equivalent circuit diagram of an embodiment of a pixel according to the disclosure.
Figure 9:
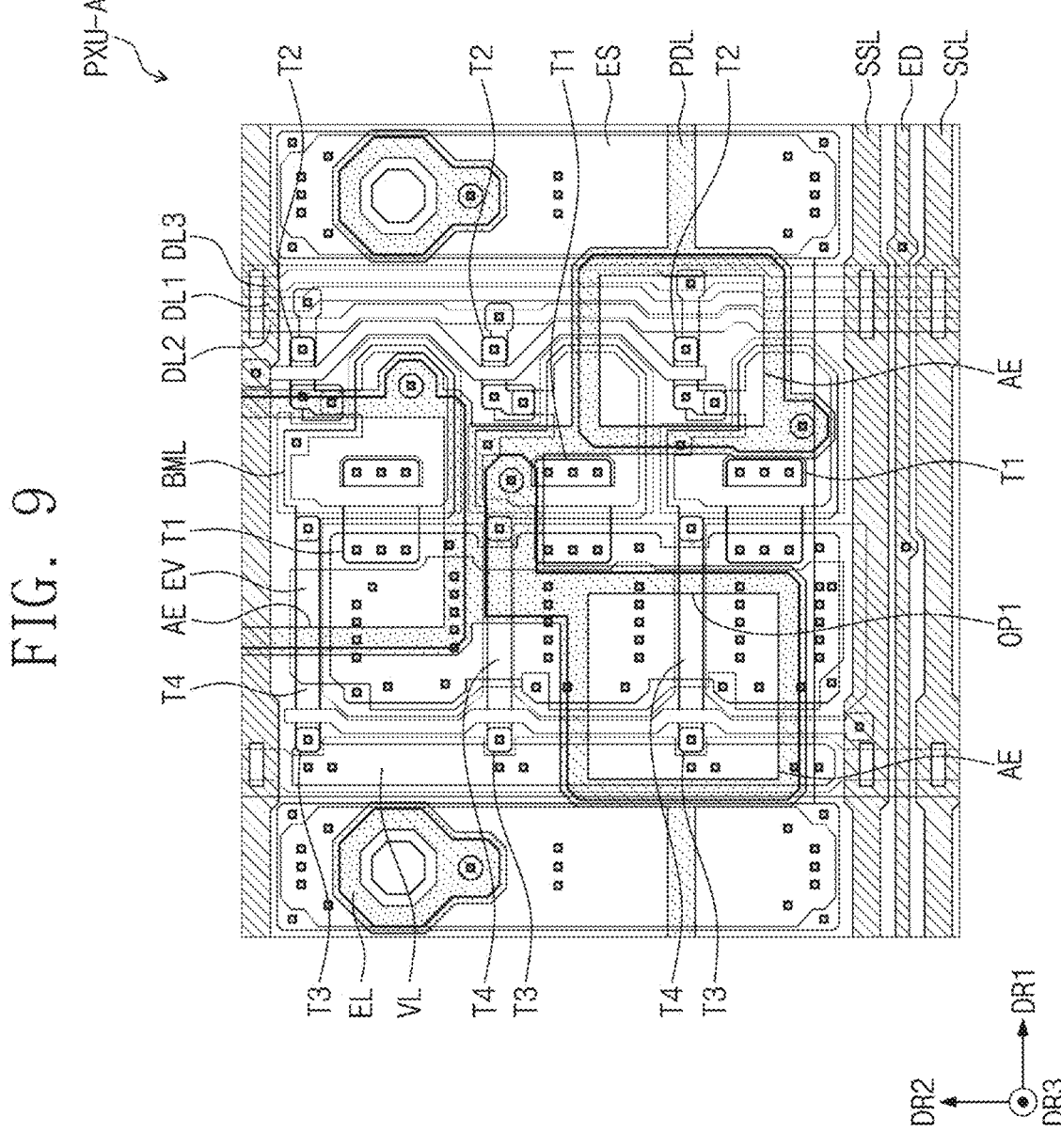
FIG. 9 is a plan view of an embodiment of a stacking sequence of conductive patterns included a unit pixel according to the disclosure.

FIG. 8 is an equivalent circuit diagram of an embodiment of a pixel according to the disclosure. FIG. 9 is a plan view of an embodiment of a stacking sequence of conductive patterns included a unit pixel according to the disclosure.

FIGS. 10A to 10G are plan views illustrating an embodiment of layers according to the stacking sequence of the conductive patterns included in the unit pixel according to the disclosure. Components identical or similar to the components illustrated in FIGS. 4 to 7 will be assigned with identical or similar reference numerals, and repetitive descriptions will hereinafter be omitted.

FIG. 8 illustrates a circuit diagram of one pixel PXij among the pixels PX11 to PXnm illustrated in FIG. 3. The j-th first scan line SCLj or the j-th second scan line SSLj illustrated in FIG. 8 may be one of the scan lines SL1 to SLn illustrated in FIG. 3, and the i-th data line DLi may be one of the data lines DL1 to DLm. Each of the pixels included in the unit pixels PXU illustrated in FIGS. 1A and 1B may have the same circuit configuration as the equivalent circuit diagram of the pixel PXij illustrated in FIG. 8. In this embodiment, the pixel PXij may include at least one light-emitting element OLED and a pixel circuit.

In this embodiment, the pixel circuit of the pixel PXij includes a first transistor T1, a second transistor T2, a third transistor T3, a fourth transistor T4, and a capacitor Cst. Each of the first to fourth transistors T1, T2, T3, and T4 is an N-type transistor with an oxide semiconductor as a semiconductor pattern.

The first transistor T1 includes a first electrode connected with a first voltage line VL1, a second electrode electrically connected with an anode (a first electrode) of the light-emitting element OLED, and a gate electrode connected with one end of the capacitor Cst. The first transistor T1 may supply a drive current to the light-emitting element OLED in response to a data signal Di transferred by the data line DLi depending on a switching operation of the second transistor T2.

The second transistor T2 includes a first electrode connected with the data line DLi, a second electrode connected with the gate electrode of the first transistor T1, and a gate electrode connected with the first scan line SCLj. The second transistor T2 may be turned on in response to a first scan signal SCj transferred through the first scan line SCLj and may transfer, to the gate electrode of the first transistor T1, the data signal Di transferred from the data line DLi.

The third transistor T3 includes a first electrode connected with a third voltage line VL3 (an initialization voltage line), a second electrode connected with the anode of the light-emitting element OLED, and a gate electrode connected with the second scan line SSLj. The third transistor T3 may be turned on in response to a second scan signal SSj transferred through the second scan line SSLj and may transfer an initialization voltage VINT to the anode of the light-emitting element OLED. In this embodiment, the second electrode of the third transistor T3 may be connected with a node ND.

The fourth transistor T4 includes a first electrode connected with the node ND, a second electrode connected with the anode of the light-emitting element OLED, and a gate electrode connected with the first voltage line VL1. The fourth transistor T4 may be turned on by receiving a first drive voltage ELVDD from the first voltage line VL1.

The one end of the capacitor Cst is connected with the gate electrode of the first transistor T1, and the opposite end of the capacitor Cst is connected with the second electrode of the first transistor T1. The structure of the pixel PXij according to an embodiment is not limited to the structure illustrated in FIG. 8. The number of transistors included in the pixel PXij, the number of capacitors included in the pixel PXij, and the connection relationship therebetween may be diversely modified.

FIG. 9 is a plan view of an embodiment of a stacking sequence of conductive patterns included a unit pixel according to the disclosure. FIGS. 10A to 10G are plan views illustrating an embodiment of layers according to the stacking sequence of the conductive patterns included in the unit pixel PXU-A according to the disclosure. The reference numerals of components disposed in different layers among the components illustrated in FIGS. 10A to 10G are described only on the corresponding layers, and omitted reference numerals will be described with reference to FIGS. 10A to 10G.

Figure 10A:
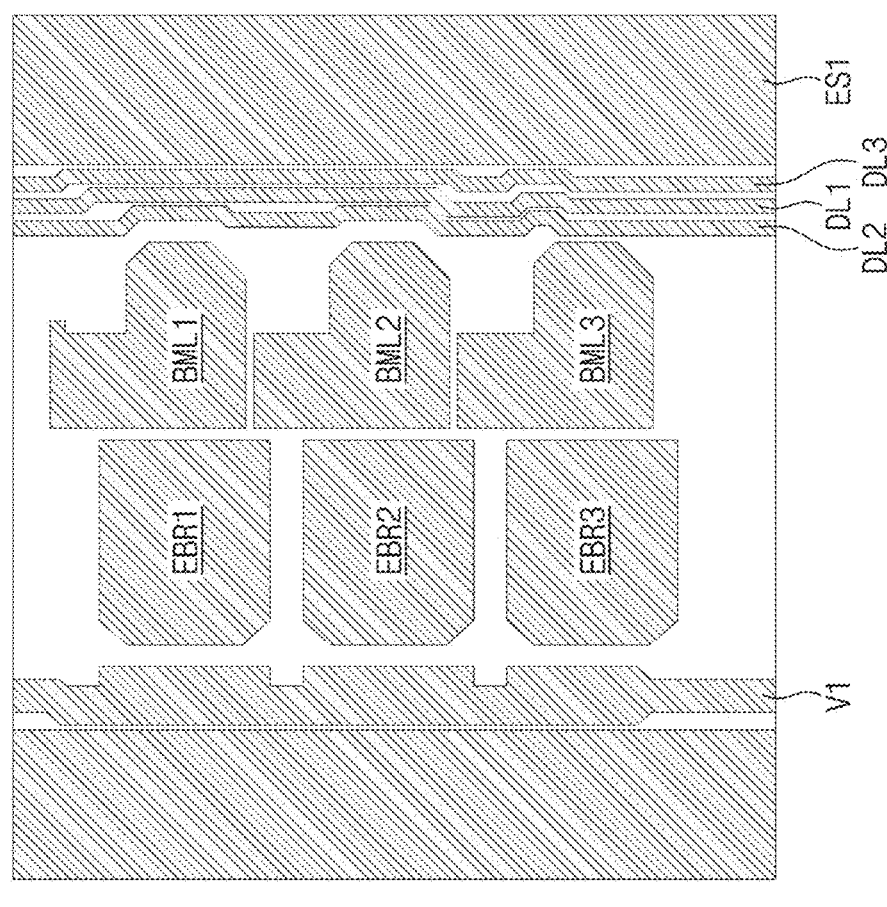

Referring to FIGS. 9 and 10A, a first conductive layer MSL1-A according to the disclosure may include a first initialization line V1 of an initialization voltage line VL, first patterns EBR1, EBR2, and EBR3 of a first voltage line EV, a light-blocking layer BML, first to third data lines DL1, DL2, and DL3, and a first line ES1 of a second voltage line ES.

The first initialization line V1, the first to third data lines DL1, DL2, and DL3, and the first line ES1 of the second voltage line ES may extend in the second direction DR2 and may be sequentially arranged in the first direction DR1 so as to be spaced apart from each other.

In this embodiment, the first patterns EBR1, EBR2, and EBR3 of the first voltage line EV may be individually disposed in three pixels, respectively. The first patterns EBR1, EBR2, and EBR3 may be disposed between the first initialization line V1 and the light-blocking layer BML and may be arranged in the second direction DR2 so as to be spaced apart from each other.

The light-blocking layer BML may be disposed between the first patterns EBR1, EBR2, and EBR3 of the first voltage line EV and the first to third data lines DL1, DL2, and DL3. The light-blocking layer BML may include first to third light-blocking patterns BML1, BML2, and BML3, each of which overlaps a corresponding one of the pixels. In an embodiment, each of the first to third light-blocking patterns BML1, BML2, and BML3 may be individually provided to partially overlap the semiconductor pattern of the first transistor T1 of a corresponding one of the pixels, for example.

According to an embodiment, each of the first to third light-blocking patterns BML1, BML2, and BML3 may be connected to the source S1 of the overlapping first transistor T1 and may receive a signal applied to the source S1 and form a sync structure under the semiconductor pattern.

The first to third data lines DL1, DL2, and DL3 may extend in the second direction DR2 and may be arranged in the first direction DR1 so as to be spaced apart from each other. Although FIG. 10A illustrates the second data line DL2, the first data line DL1, and the third data line DL3 sequentially arranged in the first direction DR1, the sequence in which the first to third data lines DL1, DL2, and DL3 are arranged in the first direction DR1 may be changed and is not limited to any particular embodiment.

The first conductive layer MSL1-A may be covered by a first insulating layer 10-A. The first insulating layer 10-A may be a buffer layer.

Figure 10B:
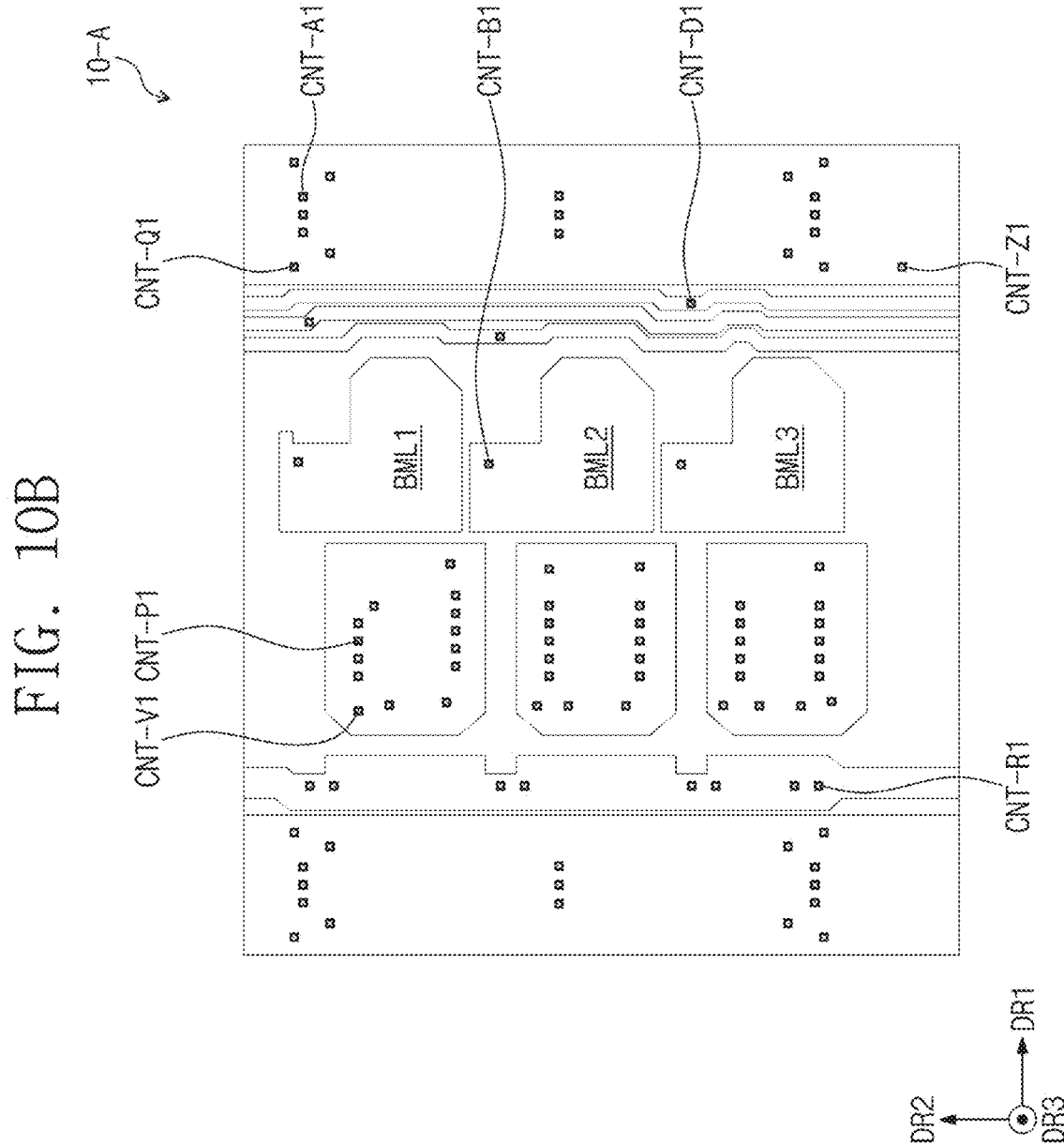

FIG. 10B illustrates contact holes defined in the first insulating layer 10-A. The first insulating layer 10-A is disposed on the base layer BS (refer to FIG. 2) and covers the first conductive layer MSL1-A. A plurality of contact holes, each of which penetrates the first insulating layer 10-A and exposes a portion of the first conductive layer MSL1-A, may be defined in the first insulating layer 10-A.

First initialization contact holes CNT-R1 may each expose a portion of the first initialization line V1.

Power contact holes CNT-P1 and first second (1-2) power contact holes CNT-V1 may be defined in the first patterns EBR1, EBR2, and EBR3 and may expose a portion of a corresponding pattern.

First light-blocking contact holes CNT-B1 may each expose a portion of a corresponding one of the first to third light-blocking patterns BML1, BML2, and BML3.

First data contact holes CNT-D1 may each expose a portion of a corresponding one of the first to third data lines DL1, DL2, and DL3.

Additional contact holes CNT-A1, additional first second (1-2) contact holes CNT-Q1, and a first side contact hole CNT-Z1 may each expose a portion of the first line ES1.

Figure 10C:
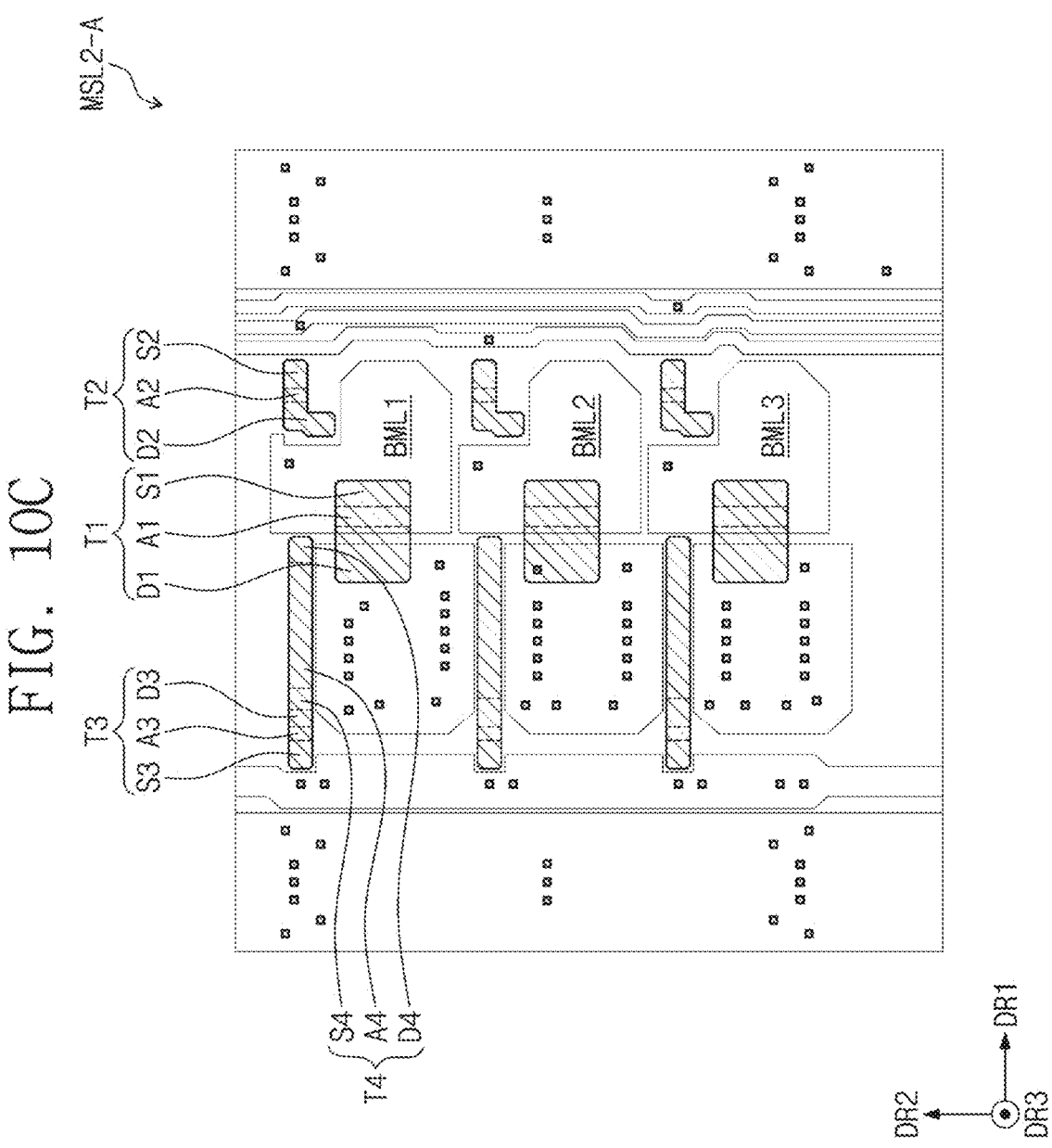

Referring to FIGS. 9 and 10C, a second conductive layer MSL2-A according to the disclosure may be disposed on the first insulating layer 10-A. The second conductive layer MSL2-A may include semiconductor patterns that are included in the first to fourth transistors T1, T2, T3, and T4, respectively.

The semiconductor pattern included in the first transistor T1 may include a first electrode S1, a second electrode D1, and a channel area A1. The channel area A1 may be disposed between the first electrode S1 and the second electrode D1. The semiconductor pattern included in the second transistor T2 may include a first electrode S2, a second electrode D2, and a channel area A2. The channel area A2 may be disposed between the first electrode S2 and the second electrode D2.

The semiconductor pattern included in the third transistor T3 may include a first electrode S3, a second electrode D3, and a channel area A3. The channel area A3 may be disposed between the first electrode S3 and the second electrode D3.

The semiconductor pattern included in the fourth transistor T4 may include a first electrode S4, a second electrode D4, and a channel area A4. The channel area A4 may be disposed between the first electrode S4 and the second electrode D4.

According to this embodiment, the first electrode S4 of the fourth transistor T4 may extend from the second electrode D3 of the third transistor T3. That is, the semiconductor pattern included in the third transistor T3 and the semiconductor pattern included in the fourth transistor T4 may form or constitute an integral pattern. The integral pattern may extend in the first direction DR1 between the first to third light-blocking patterns BML1, BML2, and BML3 corresponding to the first initialization line V1.

In this case, the integral pattern may not overlap the first patterns EBR1, EBR2, and EBR3. That is, the integral pattern may extend in the first direction DR1 across between the first patterns EBR1, EBR2, and EBR3. Accordingly, unlike in the embodiment of FIG. 5, the first pattern EV1 disposed under the semiconductor pattern of the fourth transistor T4 may be omitted on the section corresponding to FIG. 7. Thus, the fourth transistor T4 according to this embodiment may include one gate G4.

According to this embodiment, the first patterns EBR1, EBR2, and EBR3 of the first conductive layer MSL1-A may have a thickness of about 2000 angstroms (Å) to about 10000 Å.

In contrast, the integral pattern of the second conductive layer MSL2-A may have a thickness of about 100 Å to about 1500 Å. Therefore, when the integral pattern crosses the corresponding first patterns EBR1, EBR2, and EBR3, disconnection may occur on the first insulating layer 10-A due to the thickness of the first patterns EBR1, EBR2, and EBR3.

According to this embodiment, the semiconductor patterns of the third transistor T3 and the fourth transistor T4 unitary with each other may extend in the first direction DR1 to overlap the separation spaces between the first pattern EBR1, EBR2, and EBR3 without crossing the first patterns EBR1, EBR2, and EBR3. Accordingly, disconnection of the semiconductor patterns may be prevented.

FIG. 10D illustrates contact holes defined in a second insulating layer 20-A. The second insulating layer 20-A is disposed on the first insulating layer 10-A and covers a portion of the second conductive layer MSL2-A. A plurality of contact holes, each of which penetrates the second insulating layer 20-A and exposes a portion of the second conductive layer MSL2-A, may be defined in the second insulating layer 20-A.

A first gate contact hole CNT-T1 may expose part of a portion protruding from the second electrode D3 included in the second transistor T2.

The shape of the second insulating layer 20-A in the plan view may correspond to the shape of conductive patterns of a third conductive layer MSL3-A, except for the contact holes defined in the second insulating layer 20-A.

Figure 10E:
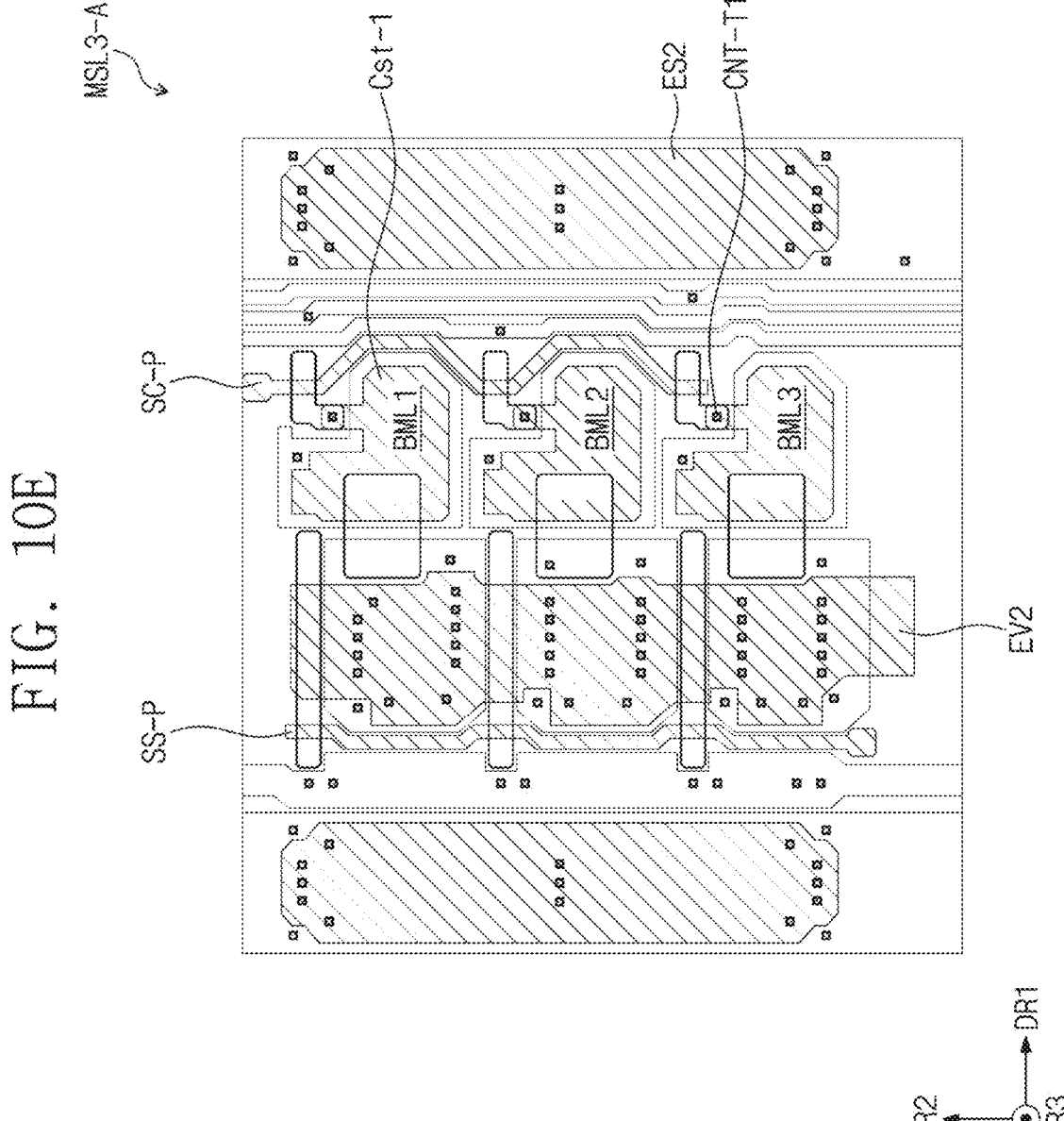

Referring to FIGS. 9 and 10E, the third conductive layer MSL3-A may be disposed on the second insulating layer 20-A. The third conductive layer MSL3 may include a sensing pattern SS-P connected with a second scan line SSL of a fourth conductive layer MSL4-A, a scan pattern SC-P connected with a first scan line SCL of the fourth conductive layer MSL4-A, and a first portion Cst-1 of the capacitor Cst.

The third conductive layer MSL3-A may include a second pattern EV2 of the first voltage line EV. The second pattern EV2 may extend in the second direction DR2 and may be provided as an integral pattern that overlaps the three pixels. Accordingly, the second pattern EV2 may overlap the first patterns EBR1, EBR2, and EBR3.

The second pattern EV2 may be disposed in the first first (1-1) power contact holes CNT-P1 and may be connected with the corresponding first patterns EBR1, EBR2, and EBR3.

The third conductive layer MSL3-A may include a second line ES2 of the second voltage line ES. The second line ES2 may overlap the first line ES1. The second line ES2 may extend in the second direction DR2. The first line ES1 and the second line ES2 may be spaced apart from the data lines DL1, DL2, and DL3 in the plan view. The second line ES2 may be disposed in the additional first first (1-1) contact holes CNT-A1 and may be connected with the first line ES1.

According to the disclosure, the third conductive layer MSL3 may include gates that are included in the first to fourth transistors T1, T2, T3, and T4, respectively.

The portion of the third conductive layer MSL3-A that overlaps the channel area A1 of the first transistor T1 may be defined as the gate G1 of the first transistor T1, and the remaining portion may be defined as the first portion Cst-1 of the capacitor Cst. The first portion Cst-1 may be disposed in the first gate contact hole CNT-T1 and may be connected with the portion protruding from the second electrode D2 of the second transistor T2.

The scan pattern SC-P that overlaps the channel area A2 of the second transistor T2 may be defined as the gate G2 of the second transistor T2, and the sensing pattern SS-P that overlaps the channel area A3 of the third transistor T3 may be defined as the gate G3 of the third transistor T3.

In this embodiment, the portion of the second pattern EV2 that overlaps the channel area A4 of the fourth transistor T4 may be defined as the gate G4 of the fourth transistor T4. Accordingly, the gate G4 of the fourth transistor T4 may be disposed in the same layer as the gates included in the first to third transistors T1, T2, and T3.

The sensing pattern SS-P may be connected with the second scan line SSL that is formed or provided in the fourth conductive layer MSL4-A to be described below and that extends in the first direction DR1. The sensing pattern SS-P may extend in the second direction DR2 between the light-blocking patterns BML1, BML2, and BML3 and the data lines DL1, DL2, and DL3.

The scan pattern SC-P may be connected with the first scan line SCL that is formed or provided in the fourth conductive layer MSL4-A to be described below and that extends in the first direction DR1. The scan pattern SC-P may extend in the second direction DR2 between the first initialization line V1 and the second pattern EV2.

The third conductive layer MSL3-A may be covered by a third insulating layer 30-A.

Figure 10F:
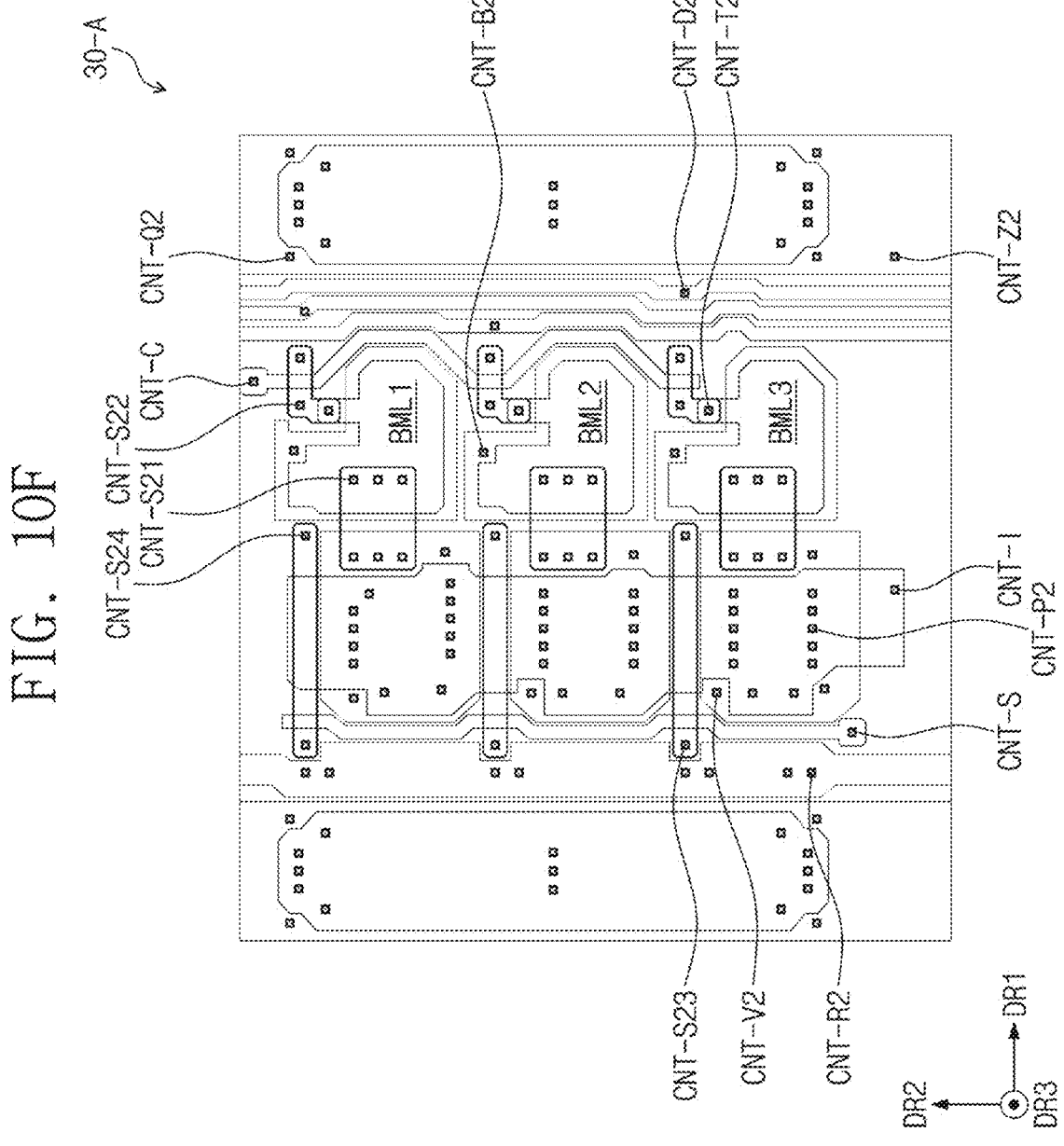

FIG. 10F illustrates contact holes defined in the third insulating layer 30-A. The third insulating layer 30-A is disposed on the second insulating layer 20-A and covers the second conductive layer MSL2-A. A plurality of contact holes, each of which penetrates the third insulating layer 30-A and exposes a portion of the third conductive layer MSL3-A, may be defined in the third insulating layer 30-A.

Second initialization contact holes CNT-R2 may overlap the first initialization contact holes CNT-R1. The second initialization contact holes CNT-R2 and the first initialization contact holes CNT-R1 may each expose a portion of the first initialization line V1.

A sensing contact hole CNT-S may expose a portion of the sensing pattern SS-P. A scan contact hole CNT-C may expose a portion of the scan pattern SC-P.

Second first (2-1) power contact holes CNT-P2 may overlap the first first (1-1) power contact holes CNT-P1. The second first (2-1) power contact holes CNT-P2 and the first first (1-1) power contact holes CNT-P1 may expose a portion of the corresponding first patterns EBR1, EBR2, and EBR3.

Second second (2-2) power contact holes CNT-V2 may overlap the first second (1-2) power contact holes CNT-V1. The second second (2-2) power contact holes CNT-V2 and the first second (1-2) power contact holes CNT-V1 may expose a portion of the corresponding first patterns EBR1, EBR2, and EBR3.

A line contact hole CNT-I may expose a portion of the second pattern EV2 protruding from the first patterns EBR1, EBR2, and EBR3.

A second light-blocking contact hole CNT-B2 may overlap the first light-blocking contact hole CNT-B1. The second light-blocking contact hole CNT-B2 and the first light-blocking contact hole CNT-B1 may expose the corresponding light-blocking patterns BML1, BML2, and BML3.

A second gate contact hole CNT-T2 may expose a portion of the first portion Cst-1 of the capacitor Cst.

Second data contact holes CNT-D2 may overlap the first data contact holes CNT-D1. The second data contact holes CNT-D2 and the first data contact holes CNT-D1 may each expose a portion of a corresponding one of the first to third data lines DL1, DL2, and DL3.

Additional second first (2-1) contact holes CNT-A2 may overlap the additional first first (1-1) contact holes CNT-A1. The additional second first (2-1) contact holes CNT-A2 and the additional first first (1-1) contact holes CNT-A1 may each expose a portion of the second line ES2.

Additional second second (2-2) contact holes CNT-Q2 may overlap the additional first second (1-2) contact holes CNT-Q1. The additional second second (2-2) contact holes CNT-Q2 and the additional first second (1-2) contact holes CNT-Q1 may each expose a portion of the first line ES1.

A second side contact hole CNT-Z2 may overlap the first side contact hole CNT-Z1. The second side contact hole CNT-Z2 and the first side contact hole CNT-Z1 may each expose a portion of the first line ES1.

Second first (2-1) semiconductor contact holes CNT-S21 may expose a portion of the first electrode S1 and a portion of the second electrode D1 of the first transistor T1.

Second second (2-2) semiconductor contact holes CNT-S22 may expose a portion of the first electrode S2 and a portion of the second electrode D2 of the second transistor T2.

Second third (2-3) semiconductor contact holes CNT-S23 may expose a portion of the first electrode S3 of the third transistor T3.

Second fourth (2-4) semiconductor contact holes CNT-S24 may expose a portion of the second electrode D4 of the fourth transistor T4.

Referring to FIGS. 9 and 10G, the fourth conductive layer MSL4-A may be disposed on the third insulating layer 30-A. The fourth conductive layer MSL4-A may include the first scan line SCL, the second scan line SSL, a first sub-pattern CP1, a second sub-pattern CP2, a second initialization line V2, and a second portion Cst-2 of the capacitor Cst.

The fourth conductive layer MSL4-A may include a third line ES3 of the second voltage line ES. The third line ES3 may overlap the first line ES1 and the second line ES2 and may extend in the second direction DR2.

The third line ES3 may be disposed in the additional second first (2-1) contact holes CNT-A2 and may be connected with the second line ES2. The third line ES3 may be connected with the first line ES1 through the additional first second (1-2) contact holes CNT-Q1 and the additional second second (2-2) contact holes CNT-Q2. Accordingly, the second voltage line ES that provides the second voltage ELVSS according to this embodiment may have a tripe structure in which patterns disposed in different layers are connected together. Thus, the resistance of the second voltage line ES may be efficiently reduced.

The first scan line SCL may be connected with the scan pattern SC-P through the scan contact hole CNT-C. The second scan line SSL may be connected with the sensing pattern SS-P through the sensing contact hole CNT-S.

A power line ED may be connected with the second pattern EV2 of the third conductive layer MSL3-A through the line contact hole CNT-I. The power line ED may be connected with the first line ES1 through the first side contact hole CNT-Z1 and the second side contact hole CNT-Z2.

The first scan line SCL, the second scan line SSL, and the power line ED may extend in the first direction DR1. The first scan line SCL, the power line ED, and the second scan line SSL may be sequentially arranged in the second direction DR2 so as to be spaced apart from each other.

The first sub-pattern CP1 may connect the second transistor T2 and a corresponding one of the data lines DL1, DL2, and DL3.

One end of the first sub-pattern CP1 may overlap the first electrode S2 of the second transistor T2 and may be disposed in the contact hole overlapping the first electrode S2 of the second transistor T2 among the second second (2-2) semiconductor contact holes CNT-S22. An opposite end of the first sub-pattern CP1 may extend to the corresponding data line and may be disposed in the first data contact hole CNT-D1 and the second data contact hole CNT-D2 and connected with the corresponding data line. Accordingly, the second transistor T2 and the data line may be connected through the first sub-pattern CP1.

One end of the second sub-pattern CP2 may overlap the second electrode D2 of the second transistor T2 and may be disposed in the contact hole overlapping the second electrode D2 of the second transistor T2 among the second second (2-2) semiconductor contact holes CNT-S22. An opposite end of the second sub-pattern CP2 may overlap the first portion Cst-1 of the capacitor Cst and may be disposed in the second gate contact hole CNT-T2.

The second initialization line V2 may overlap the first initialization line V1. The second initialization line V2 may be connected with the first initialization line V1 through the first and second initialization contact holes CNT-R1 and CNT-R2.

One portion of the second portion Cst-2 of the capacitor Cst may be disposed in the first light-blocking contact hole CNT-B1 and the second light-blocking contact hole CNT-B2 and may be connected with a corresponding light-blocking pattern.

One portion of the second portion Cst-2 of the capacitor Cst may be disposed in the contact hole overlapping the first electrode S1 of the first transistor T1 among the second first (2-1) semiconductor contact holes CNT-S21 and may be connected with the first electrode S1 of the first transistor T1.

One portion of the second portion Cst-2 of the capacitor Cst may overlap the second electrode D4 of the fourth transistor T4. The second portion Cst-2 may be disposed in the second fourth (2-4) semiconductor contact hole CNT-S24 and may connect the fourth transistor T4 and the first transistor T1.

In this embodiment, as the first electrode S4 of the fourth transistor T4 forms or constitutes an integral pattern with the second electrode D3 of the third transistor T3 and the second electrode D4 of the fourth transistor T4 is connected with the first transistor T1, the fourth transistor T4 may be provided in the state of being turned on by the first voltage ELVDD continuously applied thereto.

According to this embodiment, the fourth conductive layer MSL4-A may include a third pattern EV3 of the first voltage line EV. The third pattern EV3 may extend in the second direction DR2 and may be provided as an integral pattern that overlaps the three pixels. The third pattern EV3 may overlap the first patterns EBR1, EBR2, and EBR3 and the second pattern EV2.

The third pattern EV3 may be connected with the first pattern EBR1, EBR2, and EBR3 and the second pattern EV2 through the first first (1-1) power contact holes CNT-P1 and the second first (2-1) power contact holes CNT-P2, and the third pattern EV3 may be directly connected with the first pattern EBR1, EBR2, and EBR3 through the first second (1-2) power contact holes CNT-V1 and the second second (2-2) power contact holes CNT-V2.

Accordingly, the first voltage line EV that provides the first voltage ELVDD according to this embodiment may have a tripe structure in which patterns disposed in different layers are connected together. As the second pattern EV2 and the third pattern EV3 extend in the second direction DR2 in the first voltage line EV having the triple structure and overlap the three pixels, the path connected through the contact holes may be decreased, compared to that in a triple structure in which two layers include floated patterns spaced apart from each other in the second direction DR2. Thus, the resistance of the first voltage line EV may be efficiently reduced.

Among the components included in the display panel, the components described above with reference to FIGS. 7 and 6H to 6K may be identically applied to the components described above with reference to FIGS. 9 and 10A to 10G, and repetitive descriptions are omitted.

According to the disclosure, the voltage line applying a high level of voltage may have the tripe structure in which the patterns disposed in the different layers are connected together. As the patterns disposed on the different layers in the voltage line having the triple structure overlap the three pixels, respectively, the path connected through the contact holes may be decreased, compared to that in a triple structure in which any one layer includes floated patterns spaced apart from each other. Thus, the resistance of the voltage line may be efficiently reduced.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display panel comprising:
a base layer;
first to third pixels disposed on the base layer, each of the first to third pixels including:
a light-emitting element including an anode;
a first transistor including a gate electrode;
a second transistor including a gate electrode; and
a third transistor including a gate electrode; and
a fourth transistor including a gate electrode;

data lines, each of which is connected to a corresponding pixel among the first to third pixels, the data lines being spaced apart from each other in a first direction and extending in a second direction crossing the first direction;
a first voltage line connected to the first to third pixels and extending in the second direction; and
an initialization voltage line connected to the first to third pixels and extending in the second direction,
wherein the first transistor is connected between the first voltage line and the anode;
the second transistor is connected between a data line of the data lines and the gate electrode of the first transistor;
the third transistor is connected between the initialization voltage line and a node; and
the fourth transistor is connected between the node and the anode, and the gate electrode of the fourth transistor is connected with the first voltage line.

2. The display panel of claim 1, wherein the fourth transistor further includes an additional gate electrode branched from the first voltage line and disposed in a different layer from the gate electrode of the fourth transistor.

3. The display panel of claim 1, wherein the first voltage line includes first patterns, second patterns, and third patterns sequentially stacked and connected together.

4. The display panel of claim 3, wherein the first patterns are connected in the second direction and constitute an integral pattern, the second patterns are connected in the second direction and constitute an integral pattern, and the third patterns are connected in the second direction and constitute an integral pattern.

5. The display panel of claim 3, wherein the first patterns are arranged in the second direction and the first patterns are spaced apart from each other, the second patterns are connected in the second direction and constitute an integral pattern, and the third patterns are connected in the second direction and constitute an integral pattern.

6. The display panel of claim 1, wherein the gate electrode of the third transistor is disposed in a same layer as the gate electrode of the fourth transistor.

7. The display panel of claim 1, wherein the third transistor further includes a semiconductor pattern including a first electrode connected with the initialization voltage line and a second electrode connected with the node,
wherein the fourth transistor includes a semiconductor pattern connected with the node, and
wherein the semiconductor pattern of the third transistor and the semiconductor pattern of the fourth transistor constitute an integral pattern.

8. The display panel of claim 7, wherein the integral pattern extends in the first direction.

9. The display panel of claim 1, further comprising:
light-blocking patterns disposed between the first voltage line and the data lines and overlapping the pixels, respectively.

10. The display panel of claim 9, wherein the light-blocking patterns are arranged in the second direction and the light-blocking patterns are spaced apart from each other.

11. A display panel comprising:
a base layer;
first to third pixels disposed on the base layer, each of the first to third pixels including:
a light-emitting element including an anode;
a first transistor including a semiconductor pattern and a gate electrode;

a second transistor including a semiconductor pattern and a gate electrode;

a third transistor including a semiconductor pattern and a gate electrode; and a fourth transistor including a semiconductor pattern and a gate electrode;

data lines, each of which is connected to a corresponding pixel among the first to third pixels, the data lines being spaced apart from each other in a first direction and extending in a second direction crossing the first direction;

a first voltage line connected to the first to third pixels and extending in the second direction; and an initialization voltage line connected to the first to third pixels and extending in the second direction, wherein the semiconductor pattern of the first transistor and the gate electrode of the first transistor are connected between the first voltage line and the anode;

the semiconductor pattern of the second transistor and the gate electrode of the second transistor are connected between a data line of the data lines and the gate electrode of the first transistor;

the semiconductor pattern of the third transistor and the gate electrode of the third transistor are connected between the initialization voltage line and the semiconductor pattern of the first transistor; and the semiconductor pattern of the fourth transistor is connected between the semiconductor pattern of the first transistor and the semiconductor pattern of the third transistor, and the gate electrode the fourth transistor is connected with the first voltage line, and the semiconductor pattern of the third transistor and the semiconductor pattern of the fourth transistor constitute an integral pattern.

12. The display panel of claim 11, wherein the fourth transistor further includes an additional gate electrode branched from the first voltage line and disposed in a different layer from the gate electrode of the fourth transistor.

13. The display panel of claim 11, wherein the first voltage line includes first patterns, second patterns, and third patterns sequentially stacked and connected together.

14. The display panel of claim 13, wherein the first patterns are connected in the second direction and constitute an integral pattern, the second patterns are connected in the second direction and constitute an integral pattern, and the third patterns are connected in the second direction and constitute an integral pattern.

15. The display panel of claim 13, wherein the first patterns are arranged in the second direction and the first patterns are spaced apart from each other, the second patterns are connected in the second direction and constitute an integral pattern, and the third patterns are connected in the second direction and constitute an integral pattern.

16. The display panel of claim 11, wherein the gate electrode of the third transistor is disposed in a same layer as the gate electrode of the fourth transistor.

17. The display panel of claim 11, wherein the semiconductor pattern included in each of the first to fourth transistors includes an oxide semiconductor.

18. The display panel of claim 11, further comprising:

light-blocking patterns disposed between the first voltage line and the data lines and overlapping the pixels, respectively.

19. The display panel of claim 18, wherein the light-blocking patterns are arranged in the second direction and the light-blocking patterns are spaced apart from each other.

20. The display panel of claim 18, wherein the integral pattern extends in the first direction between the initialization voltage line and a corresponding light-blocking pattern among the light-blocking patterns.

* * * * *